United States Patent
Yoon et al.

(10) Patent No.: US 9,032,272 B2
(45) Date of Patent: May 12, 2015

(54) MEMORY SYSTEMS AND BLOCK COPY METHODS THEREOF

(71) Applicant: Samsung Electronics Co., Ltd., Suwon-si (KR)

(72) Inventors: Sangyong Yoon, Seoul (KR); Kitae Park, Seongnam-si (KR); Jinman Han, Seongnam-si (KR)

(73) Assignee: Samsung Electronics Co., Ltd. (KR)

( * ) Notice: Subject to any disclaimer, the term of this patent is extended or adjusted under 35 U.S.C. 154(b) by 198 days.

(21) Appl. No.: 13/690,544

(22) Filed: Nov. 30, 2012

(65) Prior Publication Data

US 2013/0145234 A1 Jun. 6, 2013

(30) Foreign Application Priority Data

Dec. 6, 2011 (KR) ........................ 10-2011-0129581

(51) Int. Cl.
*G11C 29/00* (2006.01)
*G06F 11/10* (2006.01)

(52) U.S. Cl.
CPC ........ *G06F 11/1008* (2013.01); *G06F 11/1072* (2013.01)

(58) Field of Classification Search
USPC .................. 714/773; 365/185.18; 711/103
See application file for complete search history.

(56) References Cited

U.S. PATENT DOCUMENTS

| | | | |
|---|---|---|---|
| 6,522,580 B2 | 2/2003 | Chen et al. | |
| 7,085,154 B2 | 8/2006 | Cho et al. | |
| 7,092,308 B2 | 8/2006 | Choi et al. | |
| 7,180,780 B1* | 2/2007 | Ho et al. | 365/185.18 |
| 7,227,776 B2 | 6/2007 | Cho et al. | |
| 7,304,886 B2 | 12/2007 | Cho et al. | |
| 7,379,333 B2 | 5/2008 | Lee et al. | |
| 7,466,597 B2 | 12/2008 | Kim | |
| 7,509,588 B2 | 3/2009 | Van Os et al. | |
| 7,818,490 B2 | 10/2010 | Conley | |
| 8,027,194 B2 | 9/2011 | Lee et al. | |
| 8,040,720 B2 | 10/2011 | Ha et al. | |
| 2004/0037124 A1 | 2/2004 | Chang | |
| 2006/0179212 A1 | 8/2006 | Kim et al. | |
| 2009/0310415 A1 | 12/2009 | Jin et al. | |
| 2010/0061151 A1 | 3/2010 | Miwa et al. | |
| 2010/0062715 A1 | 3/2010 | Kim et al. | |
| 2010/0078701 A1 | 4/2010 | Shim et al. | |
| 2010/0082890 A1 | 4/2010 | Heo et al. | |
| 2010/0110040 A1 | 5/2010 | Kim et al. | |
| 2010/0117141 A1 | 5/2010 | Shin et al. | |
| 2010/0140685 A1 | 6/2010 | Kang et al. | |
| 2010/0213527 A1 | 8/2010 | Shim et al. | |
| 2010/0224929 A1 | 9/2010 | Jeong et al. | |
| 2010/0306583 A1 | 12/2010 | Kim et al. | |
| 2010/0309237 A1 | 12/2010 | Roh | |
| 2010/0315325 A1 | 12/2010 | Hwang | |

(Continued)

*Primary Examiner* — Sam Rizk

(74) *Attorney, Agent, or Firm* — Myers Bigel Sibley & Sajovec, P.A.

(57) ABSTRACT

Methods of operating memory systems and nonvolatile memory devices include performing error checking and correction (ECC) operations on M pages of data read from a first "source" portion of M-bit nonvolatile memory cells within the nonvolatile memory device to thereby generate M pages of ECC-processed data, where M is a positive integer greater than two (2). A second "target" portion of M-bit nonvolatile memory cells within the nonvolatile memory device is then programmed with the M pages of ECC-processed data using, for example, an address-scrambled reprogramming technique.

15 Claims, 36 Drawing Sheets

(56) References Cited

U.S. PATENT DOCUMENTS

| | | |
|---|---|---|
| 2010/0315875 A1 | 12/2010 | Kim et al. |
| 2010/0322000 A1 | 12/2010 | Shim et al. |
| 2011/0013458 A1 | 1/2011 | Seol |
| 2011/0018036 A1 | 1/2011 | Hwang et al. |
| 2011/0099326 A1 | 4/2011 | Jung et al. |
| 2011/0194346 A1 | 8/2011 | Yoon et al. |
| 2011/0205817 A1 | 8/2011 | Yoon et al. |
| 2011/0222342 A1* | 9/2011 | Yoon et al. ............ 365/185.03 |
| 2013/0024605 A1* | 1/2013 | Sharon et al. ............ 711/103 |

\* cited by examiner

Fig. 5

|     | 1st PGM | 2nd PGM | 3rd PGM |
|-----|---------|---------|---------|
| ⋮   | ⋮       | ⋮       | ⋮       |
| WL2 | 6,7,8   | 6,7,8   | 6,7,8   |
| WL1 | 3,4,5   | 3,4,5   | 3,4,5   |
| WL0 | 0,1,2   | 0,1,2   | 0,1,2   |

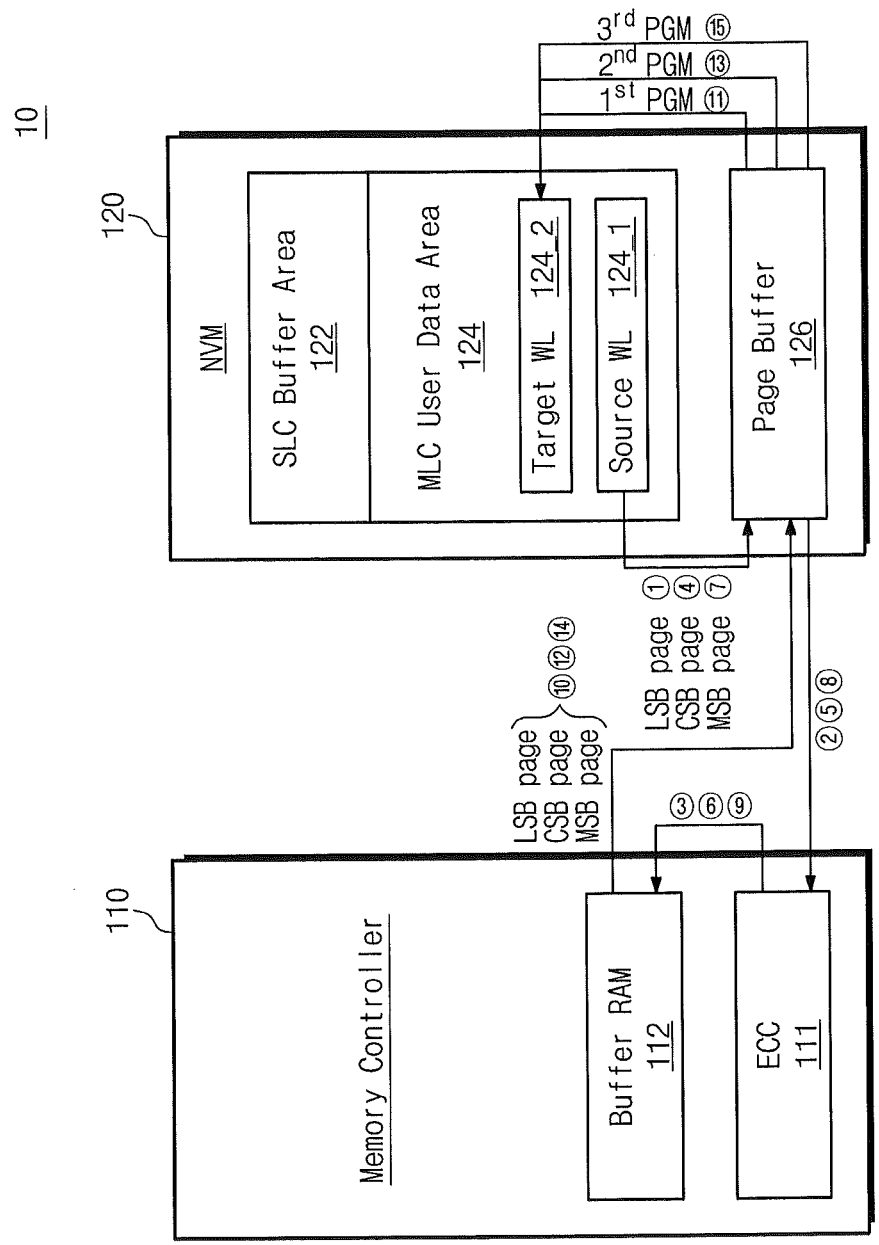

MEMORY SYSTEMS AND BLOCK COPY METHODS THEREOF

REFERENCE TO PRIORITY APPLICATION

A claim for priority under 35 U.S.C. §119 is made to Korean Patent Application No. 10-2011-0129581, filed Dec. 6, 2011, the entirety of which is hereby incorporated herein by reference.

BACKGROUND

Semiconductor memory devices may be classified into volatile semiconductor memory devices and nonvolatile semiconductor memory devices. Volatile semiconductor memory devices can perform read and write operations at high speed, while contents stored therein may be lost at power-off. Nonvolatile semiconductor memory devices may retain contents stored therein even at power-off. The nonvolatile semiconductor memory devices may be used to store contents which must be retained regardless of whether they are powered. The nonvolatile semiconductor memory devices may include a Mask Read-Only Memory (MROM), a Programmable ROM (PROM), an Erasable Programmable ROM (EPROM), an Electrically Erasable Programmable ROM (EEPROM), and the like.

A representative nonvolatile memory device may be a flash memory device. The flash memory device may be widely used as a voice and image data storing medium within information appliances such as a computer, a cellular phone, a PDA, a digital camera, a camcorder, a voice recorder, an MP3 player, a handheld PC, a game machine, a facsimile, a scanner, a printer, and the like.

A multi-bit memory device storing multi-bit data in one memory cell has become increasingly common according to an increasing need for higher integration levels. It is desirable to manage a threshold voltage distribution of multi-bit memory cells in order to improve the reliability of these cells.

SUMMARY

Methods of operating memory systems and nonvolatile memory devices according to embodiments of the invention include performing error checking and correction (ECC) operations on M pages of data read from a first "source" portion of M-bit nonvolatile memory cells within the nonvolatile memory device to thereby generate M pages of ECC-processed data, where M is a positive integer greater than two (2). A second "target" portion of M-bit nonvolatile memory cells within the nonvolatile memory device is then programmed with the M pages of ECC-processed data using an address-scrambled reprogramming technique, for example.

According to some of these embodiments of the invention, the nonvolatile memory device may include multiple nonvolatile memory chips, which may be integrated together within a packaged memory system that contains a memory controller. According to these embodiments of the invention, the first and second portions of M-bit nonvolatile memory cells (i.e., the "source" and "target" portions) may be located on the same or separate nonvolatile memory chips within the nonvolatile memory device. Moreover, the address-scrambled reprogramming technique may include programming a plurality of M-bit nonvolatile memory cells at least M−1 times. For example, the address-scrambled reprogramming technique may include programming a plurality of M-bit nonvolatile memory cells into a respective plurality of program states and then reprogramming the plurality of M-bit nonvolatile memory cells so that threshold voltages of the plurality of M-bit nonvolatile memory cells are changed but their respective plurality of program states remain unchanged. In particular, the address-scrambled reprogramming technique may include programming a target page of M-bit nonvolatile memory cells M times using a $2^{M-1}$–$2^M$– . . . $2^M$ programming sequence or a $2^M$–$2^M$– . . . $2^M$ programming sequence, for example.

According to still further embodiments of the invention, the performance of ECC operations may be preceded by reading M-pages of data from a source page of M-bit nonvolatile memory cells into a page buffer associated with a first block of nonvolatile memory within the nonvolatile memory device. In this case, the ECC operations may be preceded by sequentially transferring the M-pages of data from the page buffer to an ECC circuit. The nonvolatile memory device may include at least one nonvolatile memory chip and the page buffer and ECC circuit may be located on the same nonvolatile memory chip. According to further embodiments of the invention, the nonvolatile memory device may include a nonvolatile buffer memory of single-bit nonvolatile memory cells and the programming operations may be preceded by transferring the M pages of ECC-processed data to the single-bit nonvolatile buffer memory. The programming operations may also be preceded by reading the M pages of ECC-processed data from the single-bit nonvolatile buffer memory into the page buffer.

According to still further embodiments of the invention, the ECC circuit may be located within a memory controller, which contains a random access buffer memory (e.g., SDRAM). The programming operations may also be preceded by transferring the M pages of ECC-processed data to the random access buffer memory and then to the page buffer. The ECC circuit may be located within the memory controller, which includes a random access buffer memory, and the programming may be preceded by transferring the M pages of ECC-processed data directly from the ECC circuit to the page buffer. In some embodiments of the invention, the programming operations may include reading M pages of ECC-processed data from nonvolatile buffer memory into the page buffer multiple times.

A method of operating a nonvolatile memory device according to additional embodiments of the invention may include reading M pages of data from a first portion of M-bit nonvolatile memory cells within a nonvolatile memory device, where M is a positive integer greater than two, and then performing error checking and correction (ECC) operations on the M pages of data to thereby generate M pages of ECC-processed data. Operations are also performed to program a plurality of single-bit nonvolatile memory cells within the nonvolatile memory device with the M pages of ECC-processed data and then program a second portion of M-bit nonvolatile memory cells within the nonvolatile memory with the M pages of ECC-processed data using a reprogramming technique. This reprogramming technique may include programming a plurality of M-bit nonvolatile memory cells in the second portion into a respective plurality of program states and then reprogramming the plurality of M-bit nonvolatile memory cells at least once so that threshold voltages of the plurality of M-bit nonvolatile memory cells are changed but their respective plurality of program states remain unchanged.

According to further aspects of these embodiments of the invention, the nonvolatile memory device may include at least one nonvolatile memory chip, and the ECC operations may be preceded by transferring the M pages of data to an ECC circuit. The first portion of M-bit nonvolatile memory cells and the ECC circuit may be located on the same nonvolatile memory chip. According to further embodiments of the invention, the nonvolatile memory device may include at least one nonvolatile memory chip and a memory controller and the ECC operations may be preceded by transferring the M pages of data to the ECC circuit, which is located within the memory controller. According to still further embodiments of the invention, the nonvolatile memory device may include at least one nonvolatile memory chip and the first portion of M-bit nonvolatile memory cells and the plurality of single-bit nonvolatile memory cells may be located on the same or different nonvolatile memory chips.

According to additional embodiments of the invention, a method of operating a nonvolatile memory device may include reading M pages of data from a first portion of M-bit nonvolatile memory cells within a nonvolatile memory device, where M is a positive integer greater than two, and then performing error checking and correction (ECC) operations on the M pages of data to thereby generate M pages of ECC-processed data. A plurality of single-bit nonvolatile memory cells within the nonvolatile memory device are then programmed with the M pages of ECC-processed data before a second portion of M-bit nonvolatile memory cells within the nonvolatile memory is programmed with the M pages of ECC-processed data in the plurality of single-bit nonvolatile memory cells using a reprogramming technique. This reprogramming technique can include repeatedly programming the M-bit nonvolatile memory cells in the second portion with the same M pages of data from the plurality of single-bit nonvolatile memory cells, concurrently with repeatedly transferring the M pages of data in the plurality of single bit nonvolatile memory cells into a page buffer. In some of these embodiments of the invention, the nonvolatile memory device may include at least one nonvolatile memory chip and the first portion of M-bit nonvolatile memory cells and the plurality of single-bit nonvolatile memory cells may be located on the same or different nonvolatile memory chips.

According to still further embodiments of the invention, a method of performing a buffered copy operation in a memory system (containing a memory controller and at least one nonvolatile memory chip) can include performing error checking and correction (ECC) operations on M pages of data transferred from a first portion of M-bit nonvolatile memory cells within a first nonvolatile memory chip to an ECC circuit to thereby generate M pages of ECC-processed data, where M is a positive integer greater than two. A second portion of M-bit nonvolatile memory cells (within the first or a second nonvolatile memory chip) may then be programmed with the M pages of ECC-processed data using an address-scrambled reprogramming technique, for example. The memory controller may contain the ECC circuit and a buffer memory having volatile memory cells therein and the programming may be preceded by transferring the ECC-processed data through the buffer memory. This buffer memory may be a synchronous dynamic random access memory (SDRAM) buffer. Alternatively, the memory system may contain the ECC circuit and a buffer memory having nonvolatile memory cells therein. Based on these embodiments of the invention, the programming may be preceded by transferring the ECC-processed data through the nonvolatile memory cells in the buffer memory. These nonvolatile memory cells in the buffer memory may be single-bit nonvolatile memory cells.

BRIEF DESCRIPTION OF THE FIGURES

The above and other objects and features will become apparent from the following description with reference to the following figures, wherein like reference numerals refer to like parts throughout the various figures unless otherwise specified, and wherein:

FIG. 5 is a diagram illustrating address scrambling at a program operation of a user data area according to an embodiment of the inventive concept.

FIG. 8A is a block diagram illustrating an embodiment of a memory system using a block copy method described in FIG. 7.

DETAILED DESCRIPTION

Figure 1:
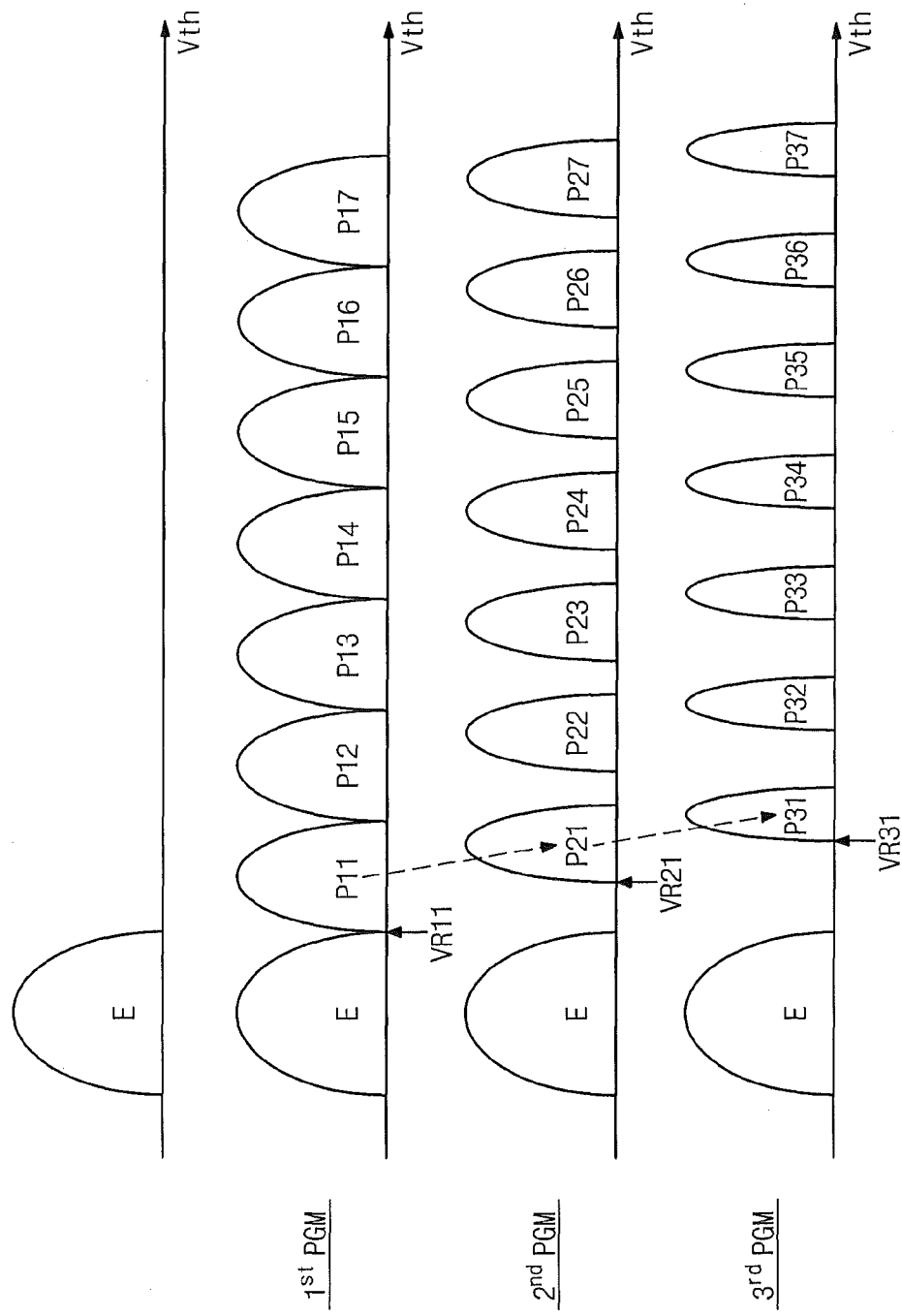
FIG. 1 is a diagram schematically illustrating a program operation executed in a reprogramming manner according to an embodiment of the inventive concept.

The inventive concept is described more fully hereinafter with reference to the accompanying drawings, in which embodiments of the inventive concept are shown. This inventive concept may, however, be embodied in many different forms and should not be construed as limited to the embodiments set forth herein. Rather, these embodiments are provided so that this disclosure will be thorough and complete, and will fully convey the scope of the inventive concept to those skilled in the art. In the drawings, the size and relative sizes of layers and regions may be exaggerated for clarity. Like numbers refer to like elements throughout.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the inventive concept.

Spatially relative terms, such as "beneath", "below", "lower", "under", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" or "under" other elements or features would then be oriented "above" the other elements or features. Thus, the exemplary terms "below" and "under" can encompass both an orientation of above and below. The device may be otherwise oriented (rotated 90 degrees or at other orientations) and the spatially relative descriptors used herein interpreted accordingly. In addition, it will also be understood that when a layer is referred to as being "between" two layers, it can be the only layer between the two layers, or one or more intervening layers may also be present.

The terminology used herein is for the purpose of describing particular embodiments only and is not intended to be limiting of the inventive concept. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items.

It will be understood that when an element or layer is referred to as being "on", "connected to", "coupled to", or "adjacent to" another element or layer, it can be directly on, connected, coupled, or adjacent to the other element or layer, or intervening elements or layers may be present. In contrast, when an element is referred to as being "directly on," "directly connected to", "directly coupled to", or "immediately adjacent to" another element or layer, there are no intervening elements or layers present.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and/or the present specification and will not be interpreted in an idealized or overly formal sense unless expressly so defined herein.

The inventive concept may provide a multi-bit program operation that is executed in a reprogramming manner. Herein, the reprogramming manner may indicate such a manner that a plurality of programming is performed to narrow a width of a threshold voltage distribution corresponding to a data value to be stored. That is, the reprogramming manner may mean a manner in which program-completed memory cells in rough threshold voltage distributions are again programmed to have fine threshold voltage distributions. Example reprogramming manners are disclosed in U.S. Patent Publication Nos. 2011/0194346, 2011/0205817, and 2011/0222342, the entirety of which are incorporated by reference herein.

FIG. 1 is a diagram schematically illustrating a program operation executed in a reprogramming manner according to an embodiment of the inventive concept. Referring to FIG. 1, a 3-bit program operation may be executed according to a 3-step reprogramming manner (first programming→second programming→and third programming).

At the first programming, respective memory cells may be programmed from an erase state to one from among eight states E and P11 to P17. Herein, the eight states E and P11 to P17, as illustrated in FIG. 1, may be adjacent to one another and have no read margins therebetween. That is, 3-bit data may be roughly programmed at the first programming.

In example embodiments, the first programming may be performed using an Incremental Step Pulse Programming (ISPP) manner. In example embodiments, at a verification operation of the first programming, a verification operation may be carried out on at least one program state. For example, at the first programming, even program states P12, P14, and P16 may be verified, while odd program states P11, P13, and P15, and P17 may not be verified. That is, the first programming is completed when the even program states P12, P14, and P16 are pass verification.

The second programming may be carried out to reprogram first programmed states P11 to P17 to denser states P21 to P27. Herein, the states P21 to P27, as illustrated in FIG. 1, may be adjacent to one another and have predetermined read margins. That is, 3-bit data programmed at the first programming may be reprogrammed at the second programming. For example, the state P11 of the first programming may be reprogrammed to a state P21 of the second programming. As a result, a threshold voltage distribution corresponding to the state P21 of the second programming may be narrower in width than that corresponding to the state P11 of the first programming. In other words, a verification voltage VR21 for verifying the state P21 of the second programming may be higher than a verification voltage VR11 for verifying the state P11 of the first programming. In example embodiments, the second programming may also be made in the ISPP manner. All program states may be verified using a verification operation of the second programming. That is, the second programming is completed when all program states P21 to P27 pass verification.

The third programming may be carried out to reprogram second programmed states P21 to P27 to denser states P31 to P37. Herein, the states P31 to P37, as illustrated in FIG. 1, may be adjacent to one another to have predetermined read margin larger than that of the second programming. That is, 3-bit data programmed at the second programming may be reprogrammed at the third programming. For example, the state P21 of the second programming may be reprogrammed to a state P31 of the third programming. As a result, a threshold voltage distribution corresponding to the state P31 of the third programming may be narrower in width than that corresponding to the state P21 of the second programming. In other words, a verification voltage VR31 for verifying the state P31 of the second programming may be higher than a verification voltage VR21 for verifying the state P21 of the second programming. In example embodiments, the third programming may be made in the ISPP manner. In example embodiments, all program states may be verified at a verification operation of the third programming. That is, the third programming is completed when all program states P31 to P37 are pass verification.

In example embodiments, a difference (e.g., VR31−VR21) between a verification voltage of the third programming and a corresponding verification voltage of the second programming may be smaller than a difference (e.g., VR21−VR11) between a verification voltage of the second programming and a corresponding verification voltage of the first programming. That is, compared with the second programming, memory cells may be more finely programmed at the third programming. Alternatively, a difference (e.g., VR31−VR21) between a verification voltage of the third programming and a corresponding verification voltage of the third programming may be larger than a difference (e.g., VR21−VR11) between a verification voltage of the second programming and a corresponding verification voltage of the first programming. That is, compared with the third programming, memory cells may be more finely programmed at the second programming.

3-bit data may be programmed at the first programming illustrated in FIG. 1. However, the inventive concept is not limited thereto. For example, 2-bit data may be programmed at the first programming. After the first programming on the 2-bit data is completed, 3-bit data may be programmed at the second programming. A 3-bit program operation is described using a 3-step programming manner ($1^{st}$ PGM, $2^{nd}$ PGM, and $3^{rd}$ PGM). However, the inventive concept is not limited thereto. For example, a program operation of the inventive concept can be performed in a 2-step reprogramming manner. A program operation executed in a reprogramming manner may be formed of 3-step programming that is executed such that a width of a threshold voltage distribution corresponding to a data value to be stored becomes narrow (or, fine).

Figure 2:
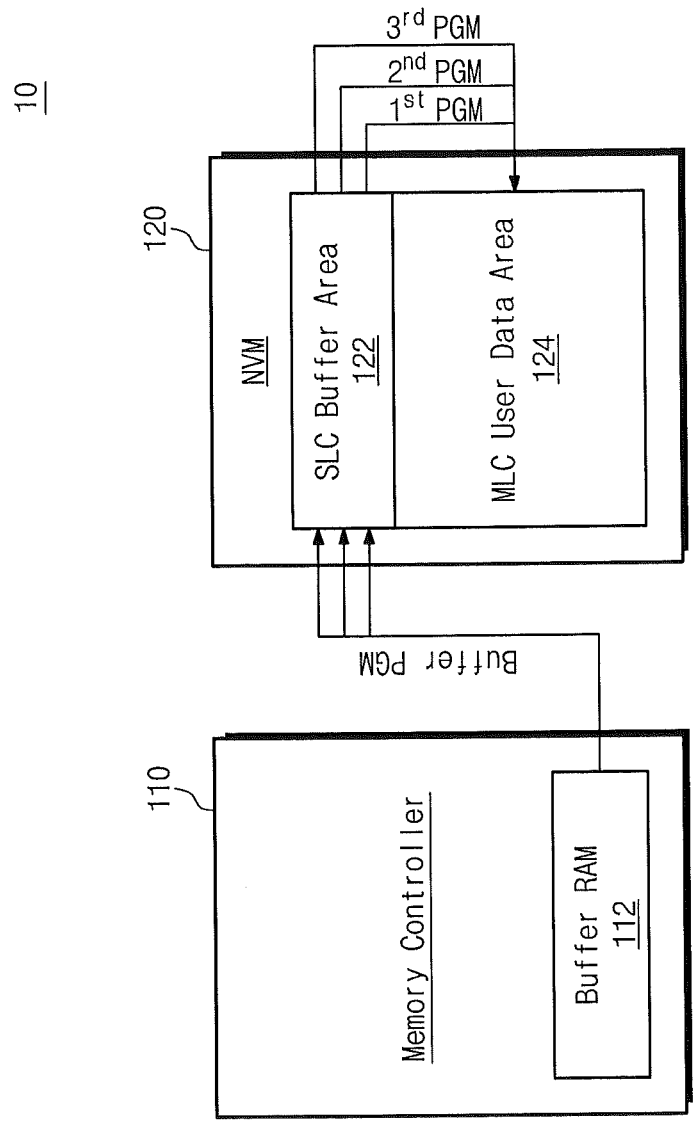
FIG. 2 is a block diagram schematically illustrating a memory system conceptually describing a program operation in FIG. 1.

FIG. 2 is a block diagram schematically illustrating a memory system conceptually describing a program operation in FIG. 1. Referring to FIG. 2, a memory system 10 may include a memory controller 110 and a nonvolatile memory device 120. With a program operation of the inventive concept, data input to a buffer RAM 112 of the memory system 10 may be first programmed in a Single-Level Cell (SLC) buffer area 122 of the nonvolatile memory device 120, and thereafter first programming, second programming, and third programming may be sequentially performed on a Multi-Level Cell (MCL) user data area (hereinafter, referred to as a user data area) 124. The buffer RAM 112 may include a volatile memory device such as DRAM, SRAM, or the like. In example embodiments, the SLC buffer area 122 can be implemented by changing a part of the user data area 124.

Figure 3:
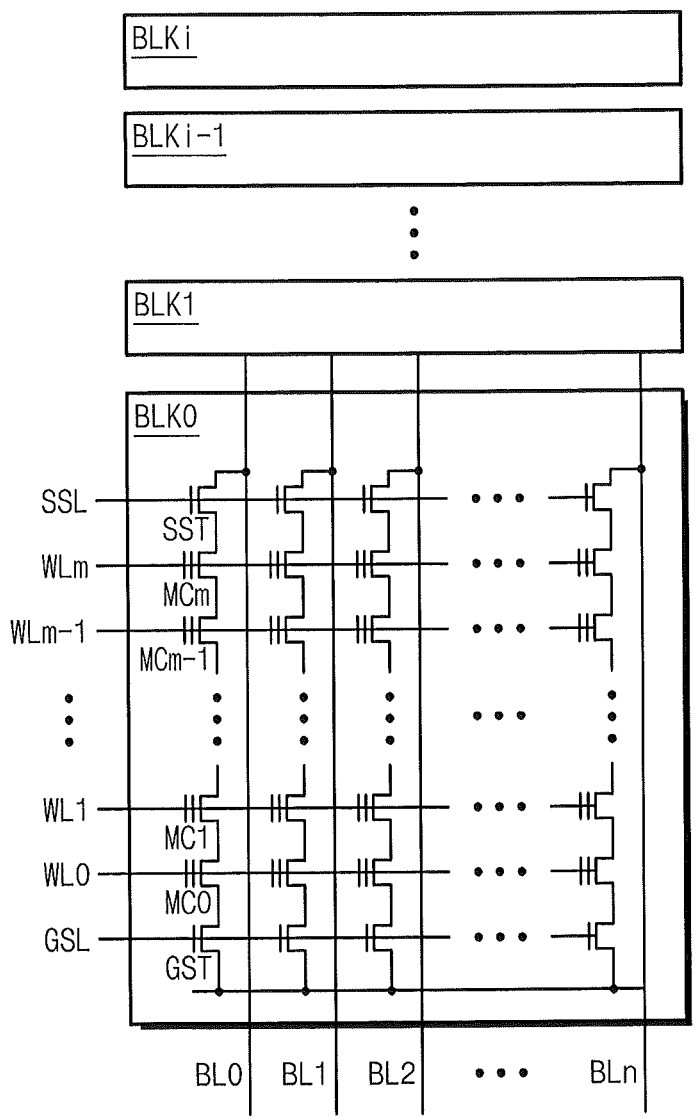
FIG. 3 is a diagram schematically illustrating a user data area of a nonvolatile memory device in FIG. 2.

FIG. 3 is a diagram schematically illustrating a user data area of a nonvolatile memory device in FIG. 2. Referring to FIG. 3, a user data area 124 may include a plurality of blocks BLK0 to BLKi (i being a natural number). Below, a first block BLK0 will be described more fully. The block BLK0 may include a plurality of strings, each of which has a string selection transistor SST connected to a string selection line SSL, a plurality of memory cells MC0 to MCm respectively connected to a plurality of word lines WL0 to WLm (m being a natural number), and a ground selection transistor GST connected to a ground selection line GSL. Herein, the string selection transistors SST may be connected to corresponding bit lines BL0 to BLn, respectively. The ground selection transistors GST may be connected to a common source line CSL. Herein, the common source line CSL may be supplied with a ground voltage or a CSL voltage (e.g., a power supply voltage) from a CSL driver (not shown). Memory cells connected with each of word lines WL0 to WLm may be referred to as a page. Herein, each memory cell may store 3-bit data.

The memory block BLK0 illustrated in FIG. 3 may have one of the all bit line architecture and the even-odd bit line architecture. Examples of the all bit line architecture and the even-odd bit line architecture are disclosed in U.S. Pat. No. 7,379,333, the entirety of which is incorporated by reference herein. Although not shown in FIG. 3, a block of the inventive concept can be formed to have the shared bit line architecture in which at least two strings are connected to a bit line. An SLC buffer area 122 illustrated in FIG. 2 may include at least one block that is formed to be substantially equal to the block BLK0 illustrated in FIG. 3. Memory cells in the SLC buffer area 122 may store 1-bit data.

Figure 4A:
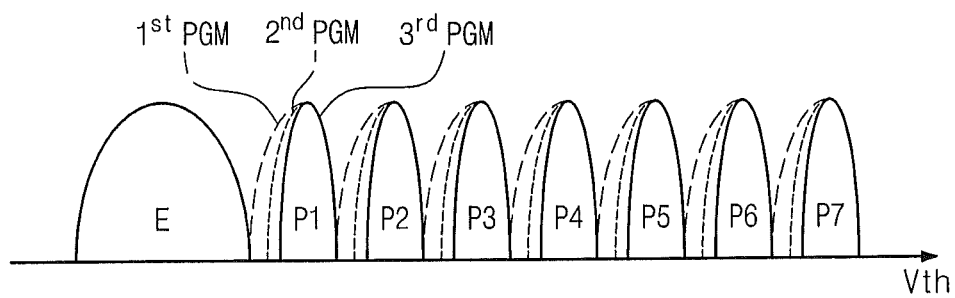
FIG. 4A is a diagram illustrating an embodiment on 3-bit data stored in one memory cell of a user data area in FIG. 3.

FIG. 4A is a diagram illustrating an embodiment on 3-bit data stored in one memory cell of a user data area in FIG. 3. Referring to FIG. 4A, as programming $1^{st}$ PGM, $2^{nd}$ PGM, and $3^{rd}$ PGM increase, distributions of program states P1 to P7 may narrow. At an erase state, a most significant bit (MSB) may correspond to data '1', a center significant bit (CSB) may correspond to data '1', and a least significant bit (LSB) may correspond to data '1'. That is, if a memory cell is at the erase state E, the most significant bit of data '1', the center significant bit of data '1', and the least significant bit of data '1' may be stored in the memory cell.

At a first program state P1, a most significant bit (MSB) may correspond to data '0', a center significant bit (CSB) may correspond to data '1', and a least significant bit (LSB) may correspond to data '1'. At a second program state P1, a most significant bit (MSB) may correspond to data '0', a center significant bit (CSB) may correspond to data '0', and a least significant bit (LSB) may correspond to data '1'. At a third program state P3, a most significant bit (MSB) may correspond to data '1', a center significant bit (CSB) may correspond to data '0', and a least significant bit (LSB) may correspond to data '1'. At a fourth program state P4, a most significant bit (MSB) may correspond to data '1', a center significant bit (CSB) may correspond to data '0', and a least significant bit (LSB) may correspond to data '0'.

At a fifth program state P5, a most significant bit (MSB) may correspond to data '0', a center significant bit (CSB) may correspond to data '0', and a least significant bit (LSB) may correspond to data '0'. At a sixth program state P6, a most significant bit (MSB) may correspond to data '0', a center significant bit (CSB) may correspond to data '1', and a least significant bit (LSB) may correspond to data '0'. At a seventh program state P7, a most significant bit (MSB) may correspond to data '1', a center significant bit (CSB) may correspond to data '1', and a least significant bit (LSB) may correspond to data '0'. Correlation between MSB, LSB, and CSB corresponding to threshold voltage states E and P1 to P7 illustrated in FIG. 4 may be exemplary. Correlation between MSB, LSB, and CSB corresponding to threshold voltage states E and P1 to P7 of the inventive concept may be combined variously.

Figure 4B:
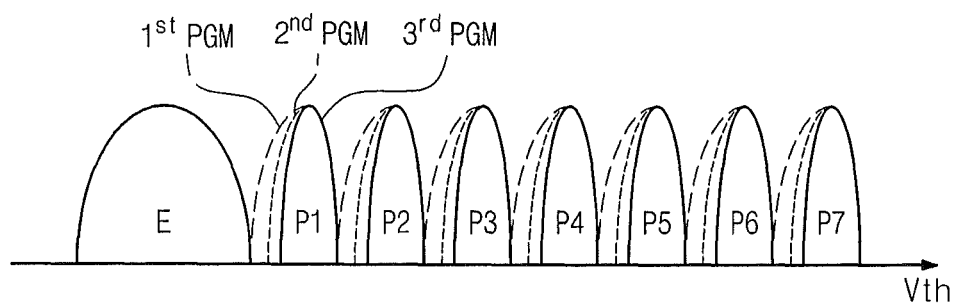
FIG. 4B is a diagram illustrating another embodiment on 3-bit data stored in one memory cell of a user data area in FIG. 3.

FIG. 4B is a diagram illustrating another embodiment on 3-bit data stored in one memory cell of a user data area in FIG. 3. Referring to FIG. 4B, an erase state E may correspond to data '111', a first program state P1 to data '110', a second program state P2 to data '100', a third program state P3 to data '101', a fourth program state P4 to data '001', a fifth program state P5 to data '000', a sixth program state P6 to data '010', and a seventh program state P7 to data '011'.

Figure 4C:
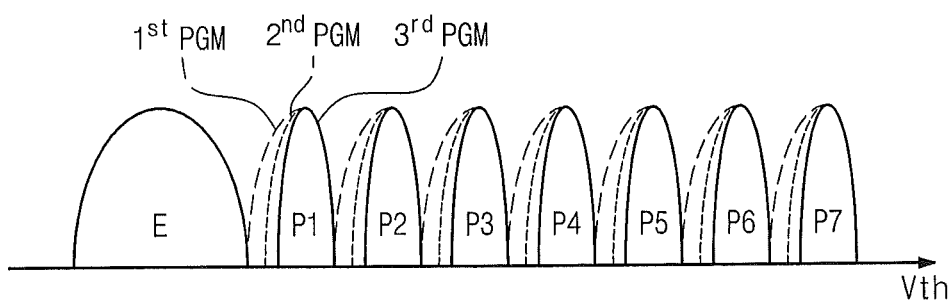
FIG. 4C is a diagram illustrating still another embodiment on 3-bit data stored in one memory cell of a user data area in FIG. 3.

FIG. 4C is a diagram illustrating still another embodiment on 3-bit data stored in one memory cell of a user data area in FIG. 3. Referring to FIG. 4C, an erase state E may correspond to data '111', a first program state P1 to data '011', a second program state P2 to data '001', a third program state P3 to data '000, a fourth program state P4 to data '010, a fifth program state P5 to data '110, a sixth program state P6 to data '100, and a seventh program state P7 to data '101. As illustrated in FIGS. 4A, 4B, and 4C, each of memory cells in a user data area 124 may store MSB, CSB, and LSB. Thus, three pages may be programmed when memory cells (or, a page) connected to a word line of the user data area 124 are programmed.

FIG. 5 is a diagram illustrating address scrambling at a program operation of a user data area according to an embodiment of the inventive concept. Referring to FIG. 5, three pages MSB page, CSB page, and LSB page may be programmed at memory cells corresponding to each of word lines WL0, WL1, etc., and the three pages MSB page, CSB page, and LSB page may be programmed by a program operation that is performed according three steps $1^{st}$ PGM, $2^{nd}$ PGM, and $3^{rd}$ PGM. As illustrated in FIG. 5, programming $1^{st}$ PGM, $2^{nd}$ PGM, and $3^{rd}$ PGM of three pages 0, 1, and 2 corresponding to a word line (e.g., WL0) may not be continuous. That is, one programming is performed, and a next programming may be executed after at least programming of at least another word line (e.g., WL1 or WL2) is carried out. For example, second programming $2^{nd}$ PGM of a first word line WL0 may not be continuous with first programming $1^{st}$ PGM of the first word line WL0, and may be performed after the first programming $1^{st}$ PGM of a second word line WL1. Further, third programming $3^{rd}$ PGM of the first word line WL0 may not be continuous with second programming $2^{nd}$ PGM of the first word line WL0, and may be performed after the second programming $2^{nd}$ PGM of the second word line WL1 as illustrated in FIG. 5. The inventive concept is not limited to the address scrambling illustrated in FIG. 5. Address scrambling of the inventive concept may be implemented variously. Example address scrambling is disclosed in U.S. Pat. No. 8,027,194 and U.S. Patent Publication Nos. 2011/020581 and 2011/022234, the entirety of which is incorporated by reference herein. A program operation according to an embodiment of the inventive concept may be applicable to a block copy. Herein, the block copy may be used at a copyback operation or a merge operation of a nonvolatile memory device. Herein, the merge operation may mean programming valid pages in at least two blocks in a new block.

Figure 6:
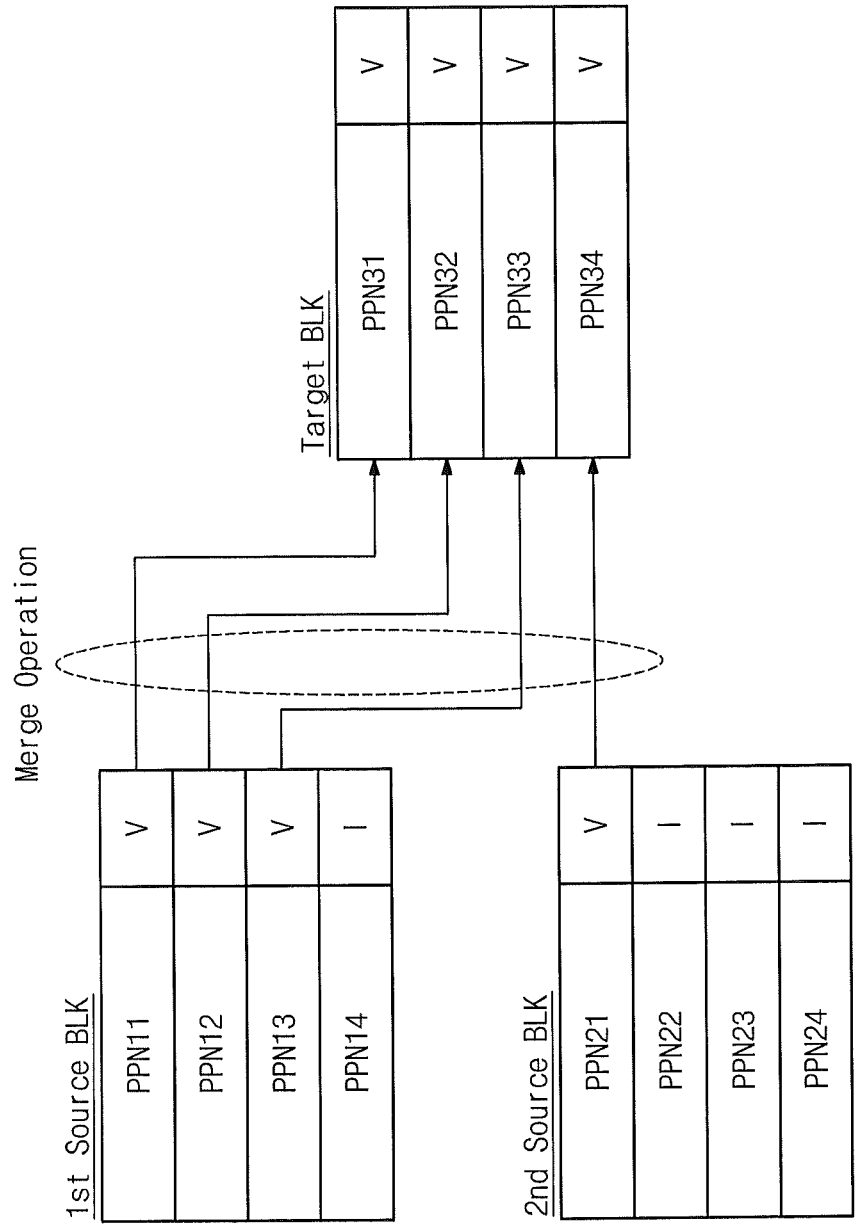
FIG. 6 is a diagram describing a merge operation of a nonvolatile memory device according to an embodiment of the inventive concept.

FIG. 6 is a diagram describing a merge operation of a nonvolatile memory device according to an embodiment of the inventive concept. For ease of description, it is assumed that each block includes four physical pages. Since data stored in memory cells of a user data area 124 of a nonvolatile memory device 120 (refer to FIG. 2) is 3-bit data, each physical page may include an LSB page, a CSB page, and an MSB page. Further, it is assumed that a first source block has first, second, and third pages PPN11, PPN12, and PPN13 being valid data and a fourth page PPN14 being invalid data and a second source block has a first page PPN21 being valid data and second, third, and fourth pages PPN22, PPN23, and PPN24 being invalid data. Below, a page having valid data may be referred to as a valid page, and a page having invalid data may be referred to as an invalid page.

If a merge operation is executed, valid pages PPN11, PPN12, and PPN13 of the first source block and a valid page PPN21 of the second source block may be programmed at pages PPN31, PPN32, PPN33, and PPN34 of a target block according to a predetermined order, respectively. If a program operation on the target block is completed, the first and second source blocks may be erased. A merge operation on a physical page is illustrated in FIG. 6. However, a merge operation of the inventive concept is not limited thereto. For example, a merge operation on a logical page may be similar thereto. An example merge operation is disclosed in U.S. Patent Publication Nos. 2006/0179212 and 2011/0099326, the entirety of which is incorporated by reference herein.

Figure 7:
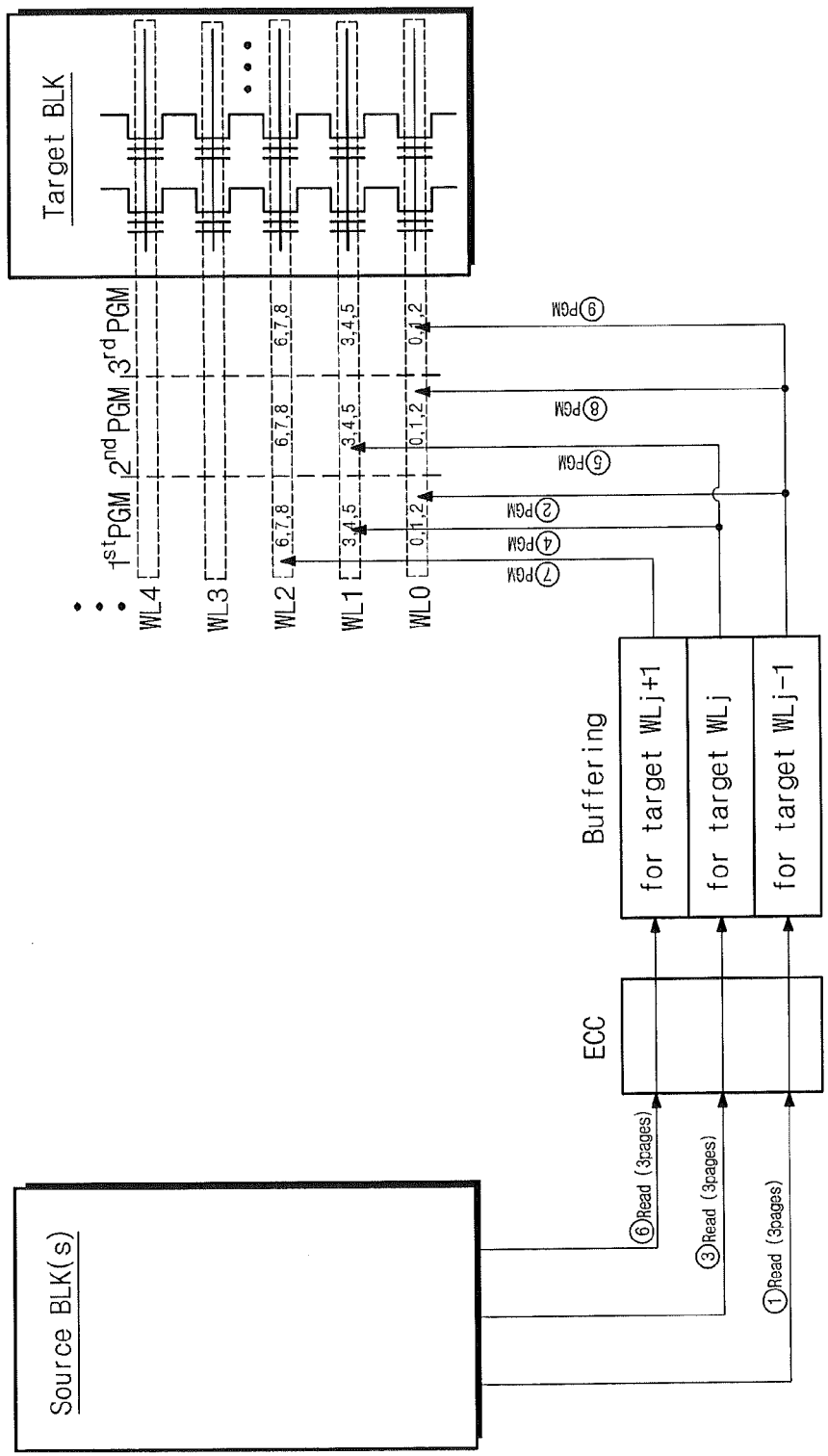
FIG. 7 is a diagram illustrating an embodiment of a block copy method of a nonvolatile memory device illustrated in FIG. 2.

FIG. 7 is a diagram illustrating an embodiment of a block copy method of a nonvolatile memory device illustrated in FIG. 2. A block copy method in FIG. 7 may follow address scrambling illustrated in FIG. 5. For ease of description, there is illustrated a procedure until first, second, and third programming $1^{st}$ PGM, $2^{nd}$ PGM, and $3^{rd}$ PGM on a word line WL0 is completed. Three pages 0, 1, and 2 may be read from at least one source block (①). Herein, 0, 1, and 2 may correspond to a first page, a second page, and a third page that are read from memory cells connected to at least one word line of the source block, respectively. For example, the first page, the second page, and the third page may correspond to an LSB page, a CSB page, and an MSB page read from memory cells connected to a word line of the source block. After error correction, the read pages 0, 1, and 2 may be buffered by a buffer area corresponding to a target word line WLj−1. Herein, the buffer area may be formed of RAM or single level cells. Afterwards, first programming 1$^{st}$ PGM may be executed such that the buffered pages 0, 1, and 2 are programmed in memory cells connected to a word line WL0 (②). Afterwards, three pages 3, 4, and 5 different from the previously read pages 0, 1, and 2 may be read from the at least one source block (③). After error corrected, the read pages 3, 4, and 5 may be buffered by a buffer area corresponding to a target word line WLj. Afterwards, first programming 1$^{st}$ PGM may be executed such that the buffered pages 3, 4, and 5 are programmed in memory cells connected to a word line WL1 (④). Second programming 2$^{nd}$ PGM may be executed such that first programmed memory cells connected to the word line WL0 are finely programmed using pages 0, 1, and 2 buffered by the buffer area corresponding to the target word line WLj−1 (⑤). Afterwards, three pages 6, 7, and 8 different from the previously read pages 0 to 5 may be read from the at least one source block (⑥). After error correction, the read pages 6, 7, and 8 may be buffered by a buffer area corresponding to a target word line WLj+1. Afterwards, first programming 1$^{st}$ PGM may be executed such that the buffered pages 6, 7, and 8 are programmed in memory cells connected to a word line WL2 (⑦). Second programming 2$^{nd}$ PGM may be executed such that first programmed memory cells connected to the word line WL1 are finely programmed using pages 3, 4, and 5 buffered by the buffer area corresponding to the target word line WLj (⑧). Afterwards, third programming 3$^{rd}$ PGM may be executed such that second programmed memory cells connected to the word line WL0 are more finely programmed using pages 0, 1, and 2 buffered by the buffer area corresponding to the target word line WLj−1 (⑨). Afterwards, the first, second, and third programming 1$^{st}$ PGM, 2$^{nd}$ PGM, and 3$^{rd}$ PGM on the word line WL0 may be completed. The above-described manner may be applied similarly to the remaining word lines. As illustrated in FIG. 7, three programming 1$^{st}$ PGM, 2$^{nd}$ PGM, and 3$^{rd}$ PGM associated with one word line may be discontinuous. With a block copy method of the inventive concept, error corrected pages may be buffered to perform three programming 1$^{st}$ PGM, 2$^{nd}$ PGM, and 3$^{rd}$ PGM that are discontinuous.

FIG. 8A is a block diagram illustrating an embodiment of a memory system using a block copy method described in FIG. 7. For ease of description, there is illustrated a procedure in which pages LSB page, CSB page, and MSB page corresponding to a source word line 124_1 are programmed in corresponding pages LSB page, CSB page, and MSB page corresponding to a target word line 124_2. Referring to FIG. 8A, an LSB page may be read from memory cells connected to the source word line 124_1, and the read LSB page may be stored in a page buffer 126 (①). The LSB page stored in the page buffer 126 may be sent to an ECC circuit 111 of a memory controller 110 (②). After error correction by the ECC circuit 111, the LSB page may be transferred to a buffer RAM 112 (③). A CSB page may be read from memory cells connected to the source word line 124_1, and the read CSB page may be stored in the page buffer 126 (④). The CSB page stored in the page buffer 126 may be transferred to the ECC circuit 111 of the memory controller 110 (⑤). After error corrected by the ECC circuit 111, the CSB page may be transferred to the buffer RAM 112 (⑥). An MSB page may be read from memory cells connected to the source word line 124_1, and the read MSB page may be stored in the page buffer 126 (⑦). The MSB page stored in the page buffer 126 may be transferred to the ECC circuit 111 of the memory controller 110 (⑧). After error correction by the ECC circuit 111, the MSB page may be transferred to the buffer RAM 112 (⑨). As understood from the above description, corrected LSB, CSB, and MSB pages may be stored in the buffer RAM 112.

Afterwards, 3-step programming 1$^{st}$ PGM, 2$^{nd}$ PGM, and 3$^{rd}$ PGM may be performed on memory cells connected to the target word line 124_2 using the LSB, CSB, and MSB pages stored in the buffer RAM 112. First of all, first programming 1$^{st}$ PGM may commence. The LSB, CSB, and MSB pages stored in the buffer RAM 112 may be sequentially transferred to the page buffer 126 (⑩), and the first programming 1$^{st}$ PGM may be executed on memory cells connected to the target word line 124_2 (⑪). In example embodiments, the page buffer 126 may be formed to store at least three pages of data. Then, second programming 2$^{nd}$ PGM may commence according to address scrambling illustrated in FIG. 7. The LSB, CSB, and MSB pages stored in the buffer RAM 112 may be sequentially transferred to the page buffer 126 (⑫), and the second programming 2$^{nd}$ PGM may be executed on memory cells connected to the target word line 124_2 (⑬). Then, third programming 3$^{rd}$ PGM may commence according to the address scrambling illustrated in FIG. 7. The LSB, CSB, and MSB pages stored in the buffer RAM 112 may be sequentially transferred to the page buffer 126 (⑭), and the third programming 3$^{rd}$ PGM may be executed on memory cells connected to the target word line 124_2 (⑮).

In FIG. 8A, there is illustrated a block copy method that LSB, CSB, and MSB pages corresponding to a source word line 124_1 are programmed in memory cells connected to a target word line 124_2. However, the inventive concept is not limited thereto. At least one page corresponding to at least one source word line can be programmed in memory cells connected to a target word line. For example, an LSB page corresponding to a first source word line, an LSB page corresponding to a second source word line, or a CSB page corresponding to a third source word line can be programmed in memory cells corresponding to one target word line. For the block copy method according to an embodiment of the inventive concept, reprogramming (1$^{st}$ PGM, 2$^{nd}$ PGM, and 3$^{rd}$ PGM) may be executed after error corrected LSB, CSB, and MSB pages are stored in the buffer RAM 112. In FIG. 8A, LSB, CSB, and MSB pages stored in memory cells connected to a source word line 124_1 is copied into memory cells connected to a target word line 124_2. However, the inventive concept is not limited thereto. For the copy method of the inventive concept, data stored in memory cells connected to at least two source word lines can be copied into memory cells connected to at least one target word line.

Figure 8B:
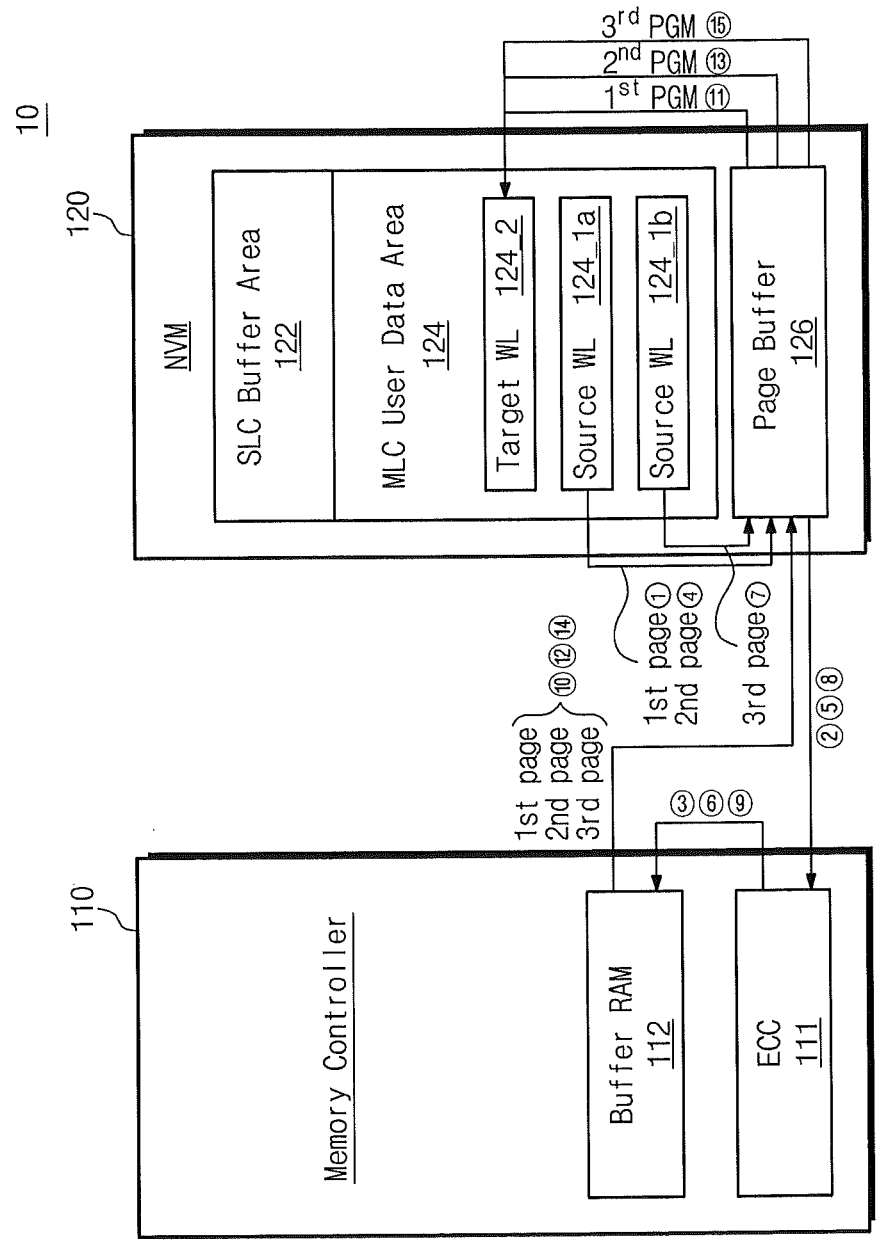
FIG. 8B is a block diagram illustrating another embodiment of a memory system using a block copy method described in FIG. 7.

FIG. 8B is a block diagram illustrating another embodiment of a memory system using a block copy method described in FIG. 7. For ease of description, there is illustrated a procedure in which first and second pages corresponding to a first source word line 124_1a and a third page corresponding to a second source word line 124_1a are programmed in corresponding pages LSB page, CSB page, and MSB page corresponding to a target word line 124_2. Referring to FIG. 8B, a first page may be read from memory cells connected to the first source word line 124_1a, and the read first page may be stored in a page buffer 126 (①). Herein, the first page may be one of LSB, CSB, and MSB pages corresponding to the first source word line 124_1a. The first page stored in the page buffer 126 may be sent to an ECC circuit 111 (②). After error correction by the ECC circuit 111, the first page may be transferred to a buffer RAM 112 (③). And then, a second page may be read from memory cells connected to the first source word line 124_1a, and the read second page may be stored in a page buffer 126 (④). Herein, the second page may be one of LSB, CSB, and MSB pages corresponding to the first source word line 124_1a, and may be different from the first page. Although not shown in figures, the second page can be one of LSB, CSB, and MSB pages corresponding to the second source word line 124_1b, and can be different from the first page. The second page stored in the page buffer 126 may be sent to the ECC circuit 111 of a memory controller 110 (⑤). After error correction by the ECC circuit 111, the second page may be transferred to a buffer RAM 112 (⑥). Subsequently, a third page may be read from memory cells connected to the second source word line 124_1b, and the read third page may be stored in the page buffer 126 (⑦). Herein, the third page may be one of LSB, CSB, and MSB pages corresponding to the second source word line 124_1b. The third page stored in the page buffer 126 may be sent to the ECC circuit 111 (⑧). After error correction by the ECC circuit 111, the third page may be transferred to a buffer RAM 112 (⑨). As understood from the above description, corrected first, second, and third pages may be stored in the buffer RAM 112.

Afterwards, 3-step programming ($1^{st}$ PGM, $2^{nd}$ PGM, and $3^{rd}$ PGM) may be performed on memory cells connected to a target word line 124_2, using the first, second, and third pages stored in the buffer RAM 112. First of all, first programming $1^{st}$ PGM may commence. The first, second, and third pages stored in the buffer RAM 112 may be sequentially transferred to the page buffer 126 (⑩), and the first programming $1^{st}$ PGM may be executed on memory cells connected to the target word line 124_2 (⑪). In example embodiments, the page buffer 126 may be formed to store at least three pages of data. Then, second programming $2^{nd}$ PGM may commence according to address scrambling illustrated in FIG. 7. The first, second, and third pages stored in the buffer RAM 112 may be sequentially transferred to the page buffer 126 (⑫), and the second programming $2^{nd}$ PGM may be executed on memory cells connected to the target word line 124_2 (⑬). Subsequently, third programming $3^{rd}$ PGM may commence according to the address scrambling illustrated in FIG. 7. The first, second, and third pages stored in the buffer RAM 112 may be sequentially transferred to the page buffer 126 (⑭), and the second programming $2^{nd}$ PGM may be executed on memory cells connected to the target word line 124_2 (⑮). For the block copy method according to another embodiment of the inventive concept, after buffered by the buffer RAM 112, first, second, and third pages associated with two source word lines 124_1a and 124_1b may be reprogrammed at memory cells connected to one target word line.

Figure 8C:
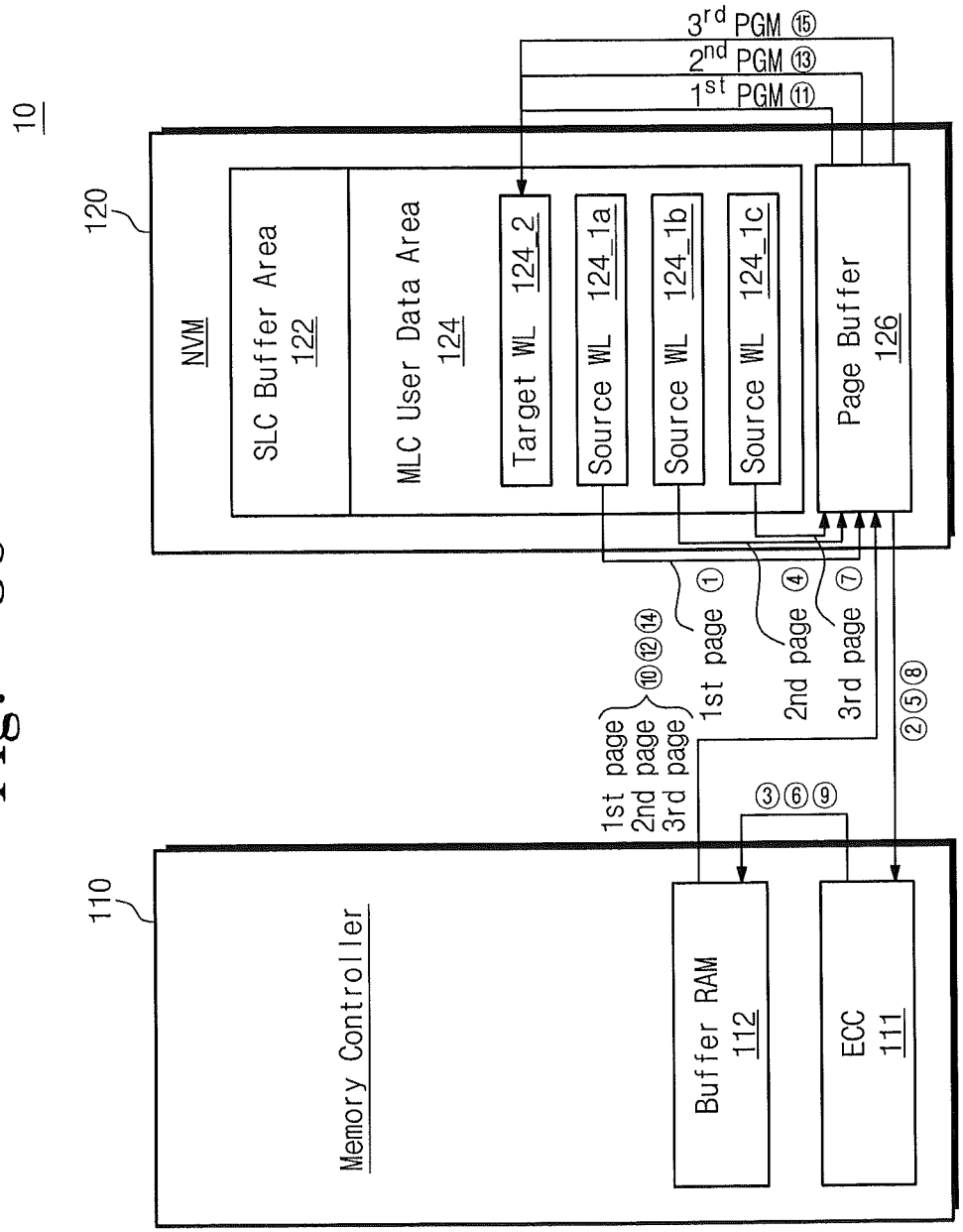
FIG. 8C is a block diagram illustrating still another embodiment of a memory system using a block copy method described in FIG. 7.

FIG. 8C is a block diagram illustrating still another embodiment of a memory system using a block copy method described in FIG. 7. For ease of description, there is illustrated a procedure in which a first page corresponding to a first source word line 124_1a, a second page corresponding to a second source word line 124_1b, and a third page corresponding to a third source word line 124_1c are programmed in corresponding pages LSB page, CSB page, and MSB page corresponding to a target word line 124_2. Referring to FIG. 8C, a first page may be read from memory cells connected to the first source word line 124_1a, and the read first page may be stored in a page buffer 126 (①). Herein, the first page may be one of LSB, CSB, and MSB pages corresponding to the first source word line 124_1a. The first page stored in the page buffer 126 may be sent to an ECC circuit 111 of a memory controller 110 (②). After error correction by the ECC circuit 111, the first page may be transferred to a buffer RAM 112 (③). And then, a second page may be read from memory cells connected to the second source word line 124_1b, and the read second page may be stored in a page buffer 126 (④). Herein, the second page may be one of LSB, CSB, and MSB pages corresponding to the second source word line 124_1b. The second page stored in the page buffer 126 may be sent to the ECC circuit 111 of the memory controller 110 (⑤). After error correction by the ECC circuit 111, the second page may be transferred to a buffer RAM 112 (⑥). Subsequently, a third page may be read from memory cells connected to the third source word line 124_1c, and the read third page may be stored in the page buffer 126 (⑦). Herein, the third page may be one of LSB, CSB, and MSB pages corresponding to the third source word line 124_1c. The third page stored in the page buffer 126 may be sent to the ECC circuit 111 (⑧). After error correction by the ECC circuit 111, the third page may be transferred to a buffer RAM 112 (⑨). As understood from the above description, corrected first, second, and third pages may be stored in the buffer RAM 112.

Afterwards, 3-step programming ($1^{st}$ PGM, $2^{nd}$ PGM, and $3^{rd}$ PGM) may be performed on memory cells connected to a target word line 124_2, using the first, second, and third pages stored in the buffer RAM 112. First of all, first programming $1^{st}$ PGM may commence. The first, second, and third pages stored in the buffer RAM 112 may be sequentially transferred to the page buffer 126 (⑩), and the first programming $1^{st}$ PGM may be executed on memory cells connected to the target word line 124_2 (⑪). In example embodiments, the page buffer 126 may be formed to store at least three pages of data. Then, second programming $2^{nd}$ PGM may commence according to address scrambling illustrated in FIG. 7. The first, second, and third pages stored in the buffer RAM 112 may be sequentially transferred to the page buffer 126 (⑫), and the second programming $2^{nd}$ PGM may be executed on memory cells connected to the target word line 124_2 (⑬). Subsequently, third programming $3^{rd}$ PGM may commence according to the address scrambling illustrated in FIG. 7. The first, second, and third pages stored in the buffer RAM 112 may be sequentially transferred to the page buffer 126 (①), and the second programming $2^{nd}$ PGM may be executed on memory cells connected to the target word line 124_2 (⑮). For the block copy method according to another embodiment of the inventive concept, after buffered by the buffer RAM 112, first, second, and third pages associated with two source word lines 124_1a and 124_1b may be reprogrammed at memory cells connected to one target word line. In FIGS. 8A, 8B, and 8C, reprogramming may be executed using error-corrected LSB, CSB, and MSB pages that were stored in the buffer RAM 122. However, the inventive concept is not limited thereto. For example, reprogramming may be executed using error-corrected LSB, CSB, and MSB pages that were stored in an SLC buffer area of a nonvolatile memory device.

Figure 9:
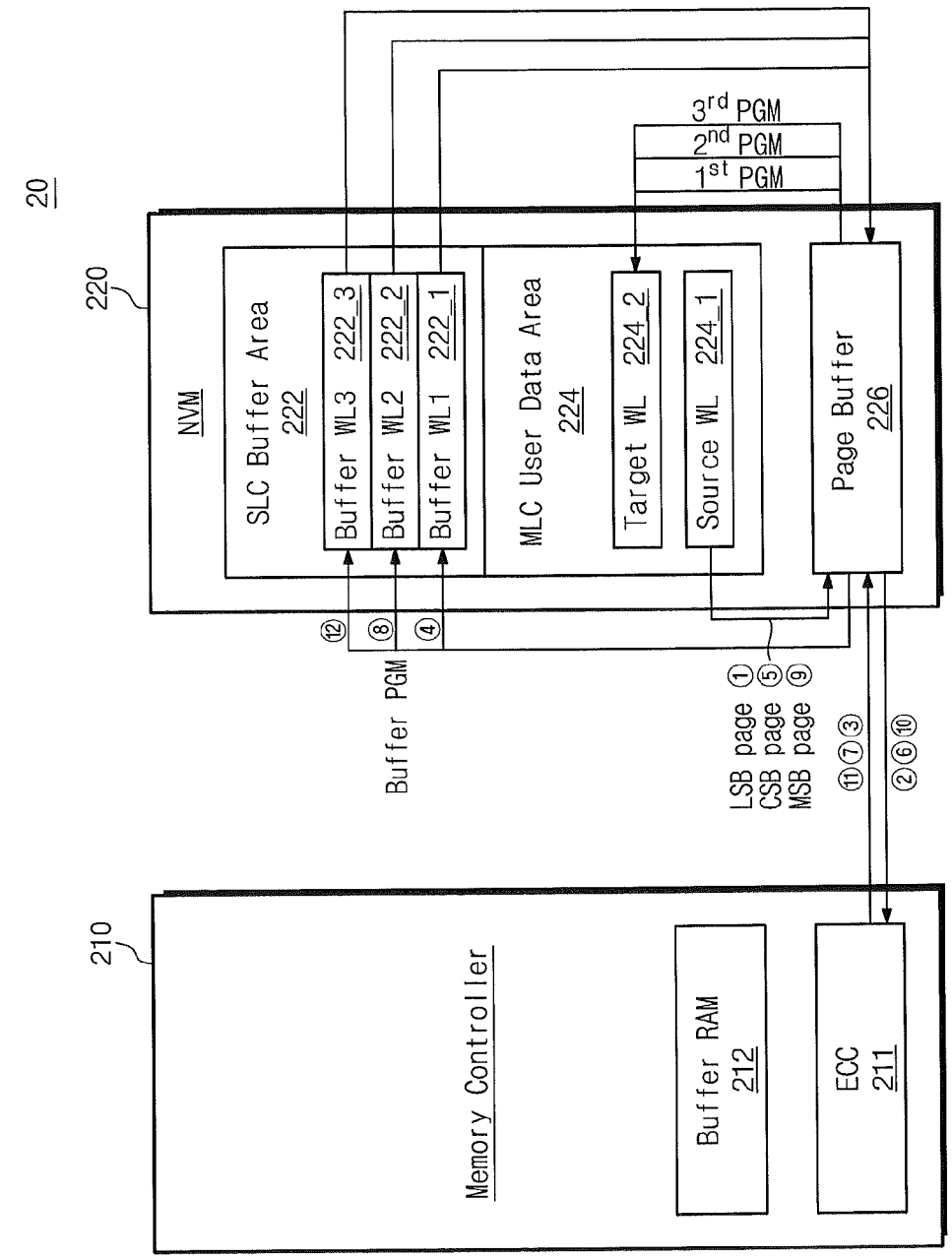
FIG. 9 is a block diagram illustrating still another embodiment of a memory system using a block copy method described in FIG. 7.

FIG. 9 is a block diagram illustrating still another embodiment of a memory system using a block copy method described in FIG. 7. An LSB page may be read from memory cells connected to a source word line 224_1, and the read LSB page may be stored in a page buffer 126 (①). The LSB page stored in the page buffer 126 may be sent to an ECC circuit 211 of a memory controller 210 (②). After error corrected by the ECC circuit 211, the LSB page may be transferred back to the page buffer 226 (③). The LSB page transferred to the page buffer 226 may be buffer programmed at memory cells connected to a first buffer word line 222_1 of an SLC buffer area 222 (④). Subsequently, a CSB page may be read from memory cells connected to the source word line 224_1, and the read CSB page may be stored in the page buffer 126 (⑤). The CSB page stored in the page buffer 126 may be sent to the ECC circuit 211 of the memory controller 210 (⑥). After error correction by the ECC circuit 211, the CSB page may be transferred back to the page buffer 226 (⑦). The CSB page transferred to the page buffer 226 may be buffer programmed at memory cells connected to a second buffer word line 222_2 of the SLC buffer area 222 (⑧). Afterwards, an MSB page may be read from memory cells connected to the source word line 224_1, and the read MSB page may be stored in the page buffer 126 (⑨). The MSB page stored in the page buffer 126 may be sent to the ECC circuit 211 of the memory controller 210 (⑩). After error correction by the ECC circuit 211, the MSB page may be transferred to the page buffer 226 (⑫). The MSB page transferred to the page buffer 226 may be buffer programmed at memory cells connected to a third buffer word line 222_3 of the SLC buffer area 222 (⑫).

A nonvolatile memory device 220 may read LSB, CSB, and MSB pages stored in the SLC buffer area 222, and may program the read LSB, CSB, and MSB pages at memory cells connected to a target word line 224_2 of a user data area 224 according to 3-step programming ($1^{st}$ PGM, $2^{nd}$ PGM, and $3^{rd}$ PGM). Herein, the 3-step programming may be carried out according to address scrambling illustrated in FIG. 7. For a block copy method according to an embodiment of the inventive concept, reprogramming may be executed using error-corrected LSB, CSB, and MSB pages that were stored in the SLC buffer area 222. In FIGS. 8 and 9, read LSB, CSB, and MSB pages may be error corrected using an ECC circuit 111/211 of a memory controller 110/210. However, the inventive concept is not limited thereto. An error correction operation on the read pages can be executed within a nonvolatile memory device.

Figure 10:
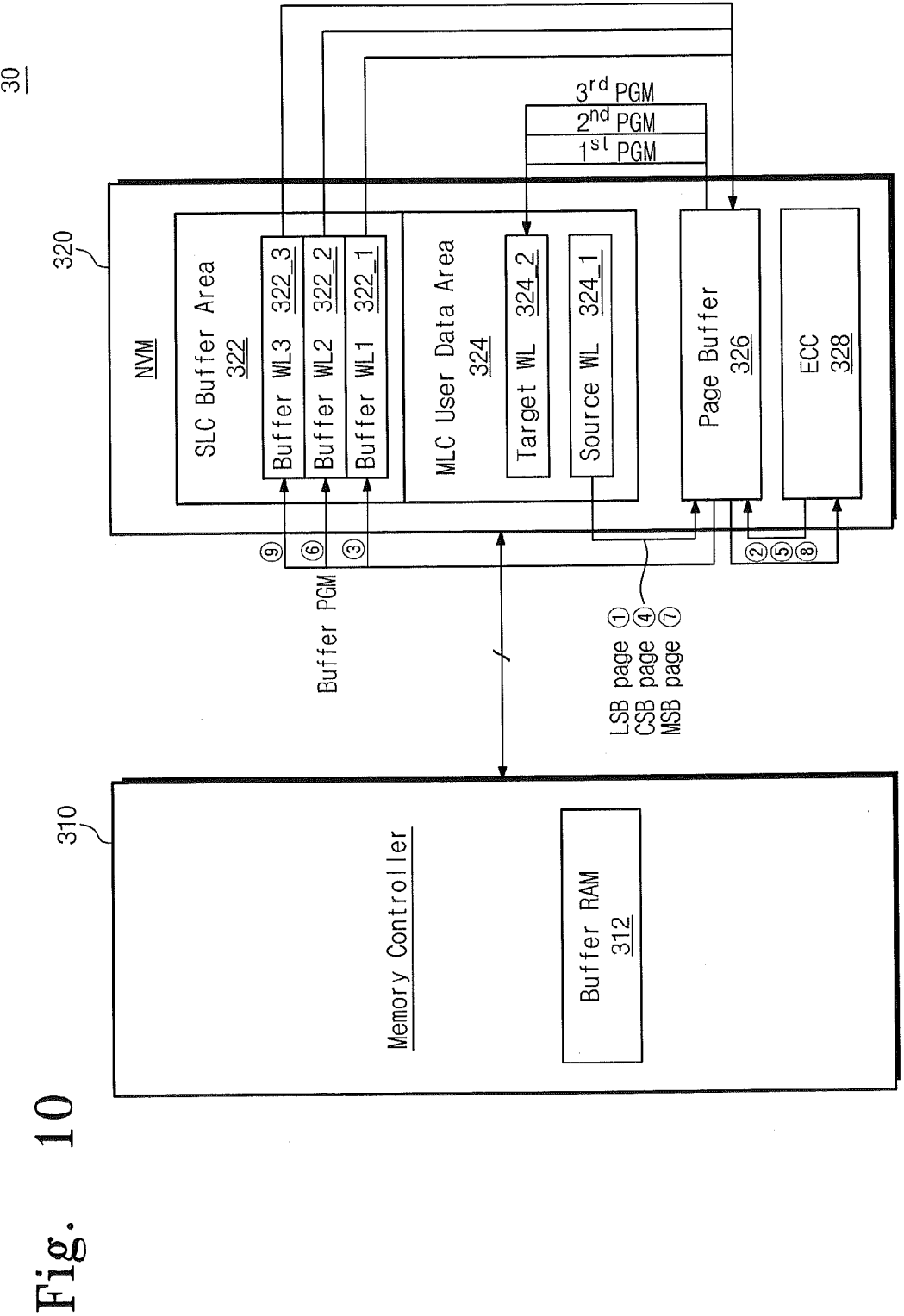
FIG. 10 is a block diagram illustrating still another embodiment of a memory system using a block copy method described in FIG. 7.

FIG. 10 is a block diagram illustrating still another embodiment of a memory system using a block copy method described in FIG. 7. An LSB page may be read from memory cells connected to a source word line 324_1, and the read LSB page may be stored in a page buffer 326 (①). The LSB page stored in the page buffer 326 may be corrected by an ECC circuit 328 of a nonvolatile memory device 320 (②), and the error-corrected LSB page may be programmed at memory cells connected to a first buffer word line 322_1 of an SLC buffer area 322 (③). Subsequently, a CSB page may be read from memory cells connected to the source word line 324_1, and the read CSB page may be stored in the page buffer 326 (④). The CSB page stored in the page buffer 326 may be corrected by the ECC circuit 328 of the nonvolatile memory device 320 (⑤), and the error-corrected CSB page may be programmed at memory cells connected to a second buffer word line 322_2 of the SLC buffer area 322 (⑥). After the CSB page is programmed, an MSB page may be read from memory cells connected to the source word line 324_1, and the read MSB page may be stored in the page buffer 326 (⑦). The MSB page stored in the page buffer 326 may be corrected by the ECC circuit 328 of the nonvolatile memory device 320 (⑧), and the error-corrected MSB page may be programmed at memory cells connected to a third buffer word line 322_3 of the SLC buffer area 322 (⑨). As described above, a buffer program operation may be executed such that error-corrected LSB, CSB, and MSB pages are stored in the SLC buffer area 322.

Afterwards, the nonvolatile memory device 320 may read LSB, CSB, and MSB pages stored in the SLC buffer area 322, and may program the read LSB, CSB, and MSB pages at memory cells connected to a target word line 324_2 of a user data area 324 according to 3-step programming ($1^{st}$ PGM, $2^{nd}$ PGM, and $3^{rd}$ PGM). Herein, the 3-step programming may be carried out according to address scrambling illustrated in FIG. 7. For a block copy method according to an embodiment of the inventive concept, reprogramming may be executed using LSB, CSB, and MSB pages that were error corrected within the nonvolatile memory device 3200 and were stored in the SLC buffer area 322.

Figure 11:
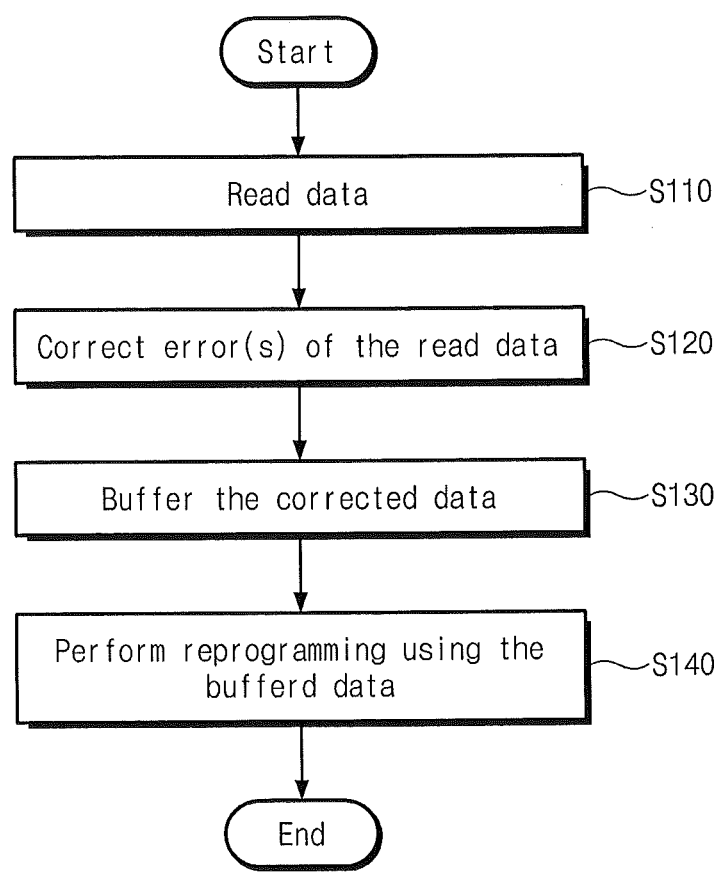
FIG. 11 is a flowchart describing a block copy method illustrated in FIG. 7.

FIG. 11 is a flowchart describing a block copy method illustrated in FIG. 7. Below, a block copy method will be more fully described with reference to FIGS. 7 to 11. In operation S110, data may be read from a source block. In operation S120, the read data may be error corrected. Herein, error correction may be made by an ECC circuit 111/211 (refer to FIG. 8A or 9) of a memory controller or by an ECC circuit 328 (refer to FIG. 10) of a nonvolatile memory device. In operation S130, the error-corrected data may be buffered. In operation S140, the buffered data may be reprogrammed at a target block according to address scrambling illustrated in FIG. 7. Afterwards, the method may be ended. With a block copy method of the inventive concept, read data may be buffered, and reprogramming may be executed using the buffered data. In FIGS. 7 to 11, read data may be buffered, and reprogramming may be executed using the buffered data. However, the inventive concept is not limited thereto. Reprogramming can be performed without buffering of read data at a block copy operation of the inventive concept.

Figure 12:
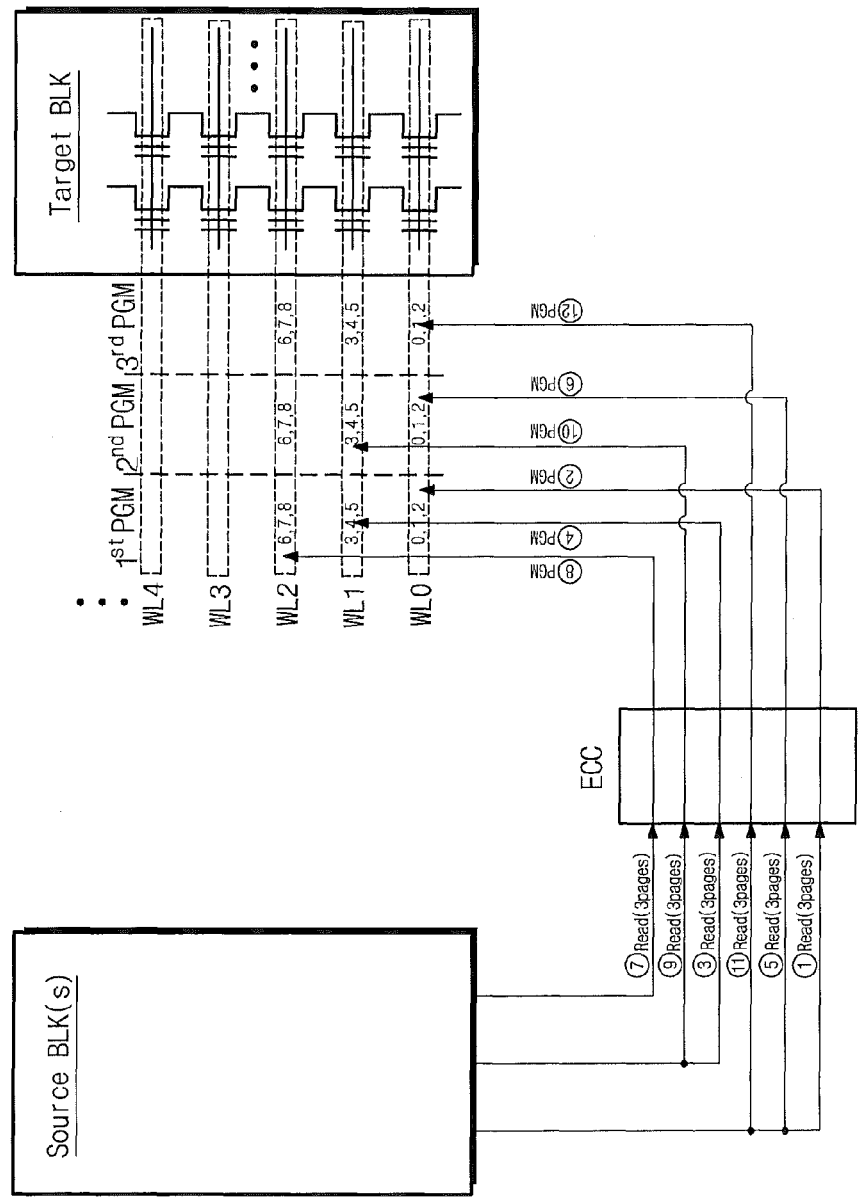
FIG. 12 is a diagram illustrating another embodiment of a block copy method of a nonvolatile memory device illustrated in FIG. 2.

FIG. 12 is a diagram illustrating another embodiment of a block copy method of a nonvolatile memory device illustrated in FIG. 2. With a block copy method in FIG. 12, programming may be performed in the same order as address scrambling illustrated in FIG. 5. For ease of description, there is illustrated a procedure until first, second, and third programming $1^{st}$ PGM, $2^{nd}$ PGM, and $3^{rd}$ PGM on a word line WL0 is completed.

Three pages 0, 1, and 2 may be read from at least one source block (①). Herein, 0, 1, and 2 may correspond to a first page, a second page, and a third page read from memory cells connected to at least one word line of a source block. The read pages 0, 1, and 2 may be error corrected. There may be executed first programming $1^{st}$ PGM in which the error-corrected pages 0, 1, and 2 are programmed at memory cells connected to a word line WL0 (②). Afterwards, three pages 3, 4, and 5 may be read from the at least one source block (③). After the read pages 3, 4, and 5 are error corrected, there may be executed first programming $1^{st}$ PGM in which the error-corrected pages 3, 4, and 5 are programmed at memory cells connected to a word line WL1 (④). The three pages 0, 1, and 2 may be read from the at least one source block to perform second programming $2^{nd}$ PGM on the word line WL0 (⑤). After the read pages 0, 1, and 2 are error corrected, there may be executed first programming $2^{nd}$ PGM in which the error-corrected pages 0, 1, and 2 are densely programmed at the memory cells connected to the word line WL0 (⑥). After the second programming $2^{nd}$ PGM on the word line WL0, three pages 6, 7, and 8 may be read from the at least one source block (⑦). After the read pages 6, 7, and 8 are error corrected, there may be executed first programming $1^{st}$ PGM in which the error-corrected pages 6, 7, and 8 are programmed at memory cells connected to a word line WL2 (⑧). Subsequently, the three pages 3, 4, and 5 may be read from the at least one source block to perform second programming $2^{nd}$ PGM on the word line WL1 (⑨). After the read pages 3, 4, and 5 are error corrected, there may be executed first programming $2^{nd}$ PGM in which the error-corrected pages 3, 4, and 5 are densely programmed at the memory cells connected to the word line WL1 (⑩).

The three pages 0, 1, and 2 may be read from the at least one source block to perform third programming $3^{rd}$ PGM on the word line WL0 (⑪). After the read pages 0, 1, and 2 are error corrected, there may be executed third programming 3$^{rd}$ PGM in which the error-corrected pages 0, 1, and 2 are more densely programmed at the memory cells connected to the word line WL0 (⑫). Thus, 3-step programming 1$^{st}$ PGM, 2$^{nd}$ PGM, and 3$^{rd}$ PGM on the word line WL0 may be completed. 3-step programming on the remaining word lines may be performed in the same manner as described above. As illustrated in FIG. 12, three programming 1$^{st}$ PGM, 2$^{nd}$ PGM, and 3$^{rd}$ PGM associated with one word line may be discontinuous. With a block copy method of the inventive concept, to perform three programming 1$^{st}$ PGM, 2$^{nd}$ PGM, and 3$^{rd}$ PGM being discontinuous, required pages may be read and error corrected whenever each programming is executed.

Figure 13:
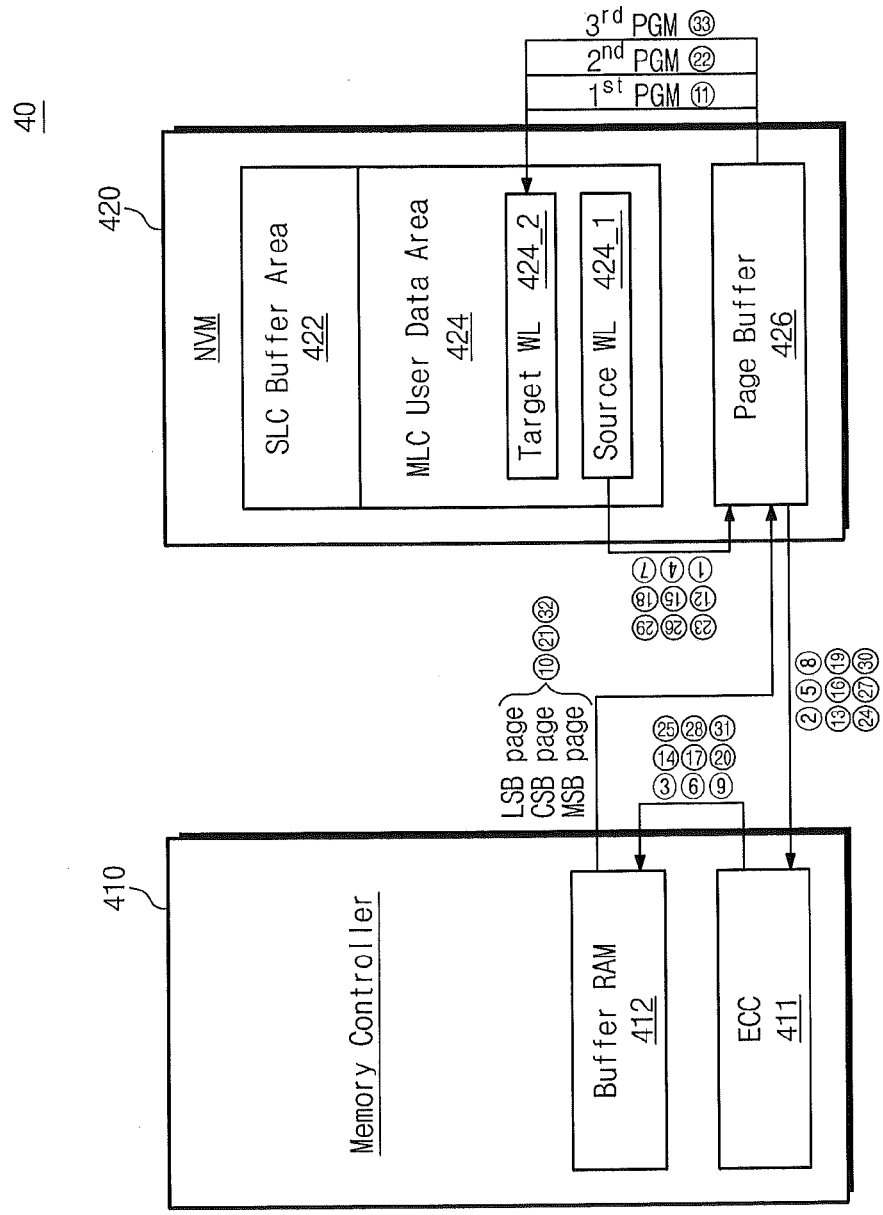
FIG. 13 is a block diagram illustrating an embodiment on a memory system using a block copy method illustrated in FIG. 12.

FIG. 13 is a block diagram illustrating an embodiment on a memory system using a block copy method illustrated in FIG. 12. First programming 1$^{st}$ PGM will be executed as follow. LSB, CSB, and MSB pages may be sequentially read from memory cells connected to a source word line 424_1, and the read LSB, CSB, and MSB pages may be error corrected. For example, the read LSB page may be stored in a page buffer 426 (①), and the LSB page stored in the page buffer 426 may be sent to an ECC circuit 411 (①). After error corrected by the ECC circuit 411, the LSB page may be transferred to a buffer RAM 412 (③). The CSB and MSB pages may be stored in the buffer RAM 412 in the same manner as described above. Thus, the error-corrected CSB and MSB pages may be stored in the buffer RAM 412.

Afterwards, the LSB, CSB, and MSB pages may be sent to the page buffer 426 (⑩), and first programming 1$^{st}$ PGM on memory cells connected to a target word line 424_2 may be executed using the LSB, CSB, and MSB pages stored in the page buffer 426 (⑪). Thus, the first programming 1$^{st}$ PGM may be completed. Second programming 2$^{nd}$ PGM may be executed according to address scrambling illustrated in FIG. 12 in a manner similar to the first programming 1$^{st}$ PGM (refer to 12 to 22 in circles). Herein, verification voltages corresponding to program states P21 to P27 (refer to FIG. 1) of the second programming 2$^{nd}$ PGM may be higher than verification voltages corresponding to program states P11 to P17 (refer to FIG. 1) of the first programming 1$^{st}$ PGM. Thus, the second programming 2$^{nd}$ PGM may be ended. Third programming 3$^{rd}$ PGM may be executed according to address scrambling illustrated in FIG. 12 (23 to 33 in circles). Herein, verification voltages corresponding to program states P31 to P37 (refer to FIG. 1) of the third programming 3$^{rd}$ PGM may be higher than verification voltages corresponding to program states P21 to P27 (refer to FIG. 1) of the second programming 2$^{nd}$ PGM. Thus, the third programming 3$^{rd}$ PGM may be ended. As described above, data stored in memory cells connected to a source word line 424_1 may be reprogrammed at memory cells connected to a target word line 424_2 by the 3-step programming 1$^{st}$ PGM, 2$^{nd}$ PGM, and 3$^{rd}$ PGM. With a block copy method of the inventive concept, whenever each programming is performed, data may e read and error corrected. Afterwards, reprogramming may be performed. In FIG. 13, data may pass through a buffer RAM 412 at a block copy operation. However, the inventive concept is not limited thereto. After error correction, data can be transferred to a page buffer without passing through the buffer RAM 412.

Figure 14:
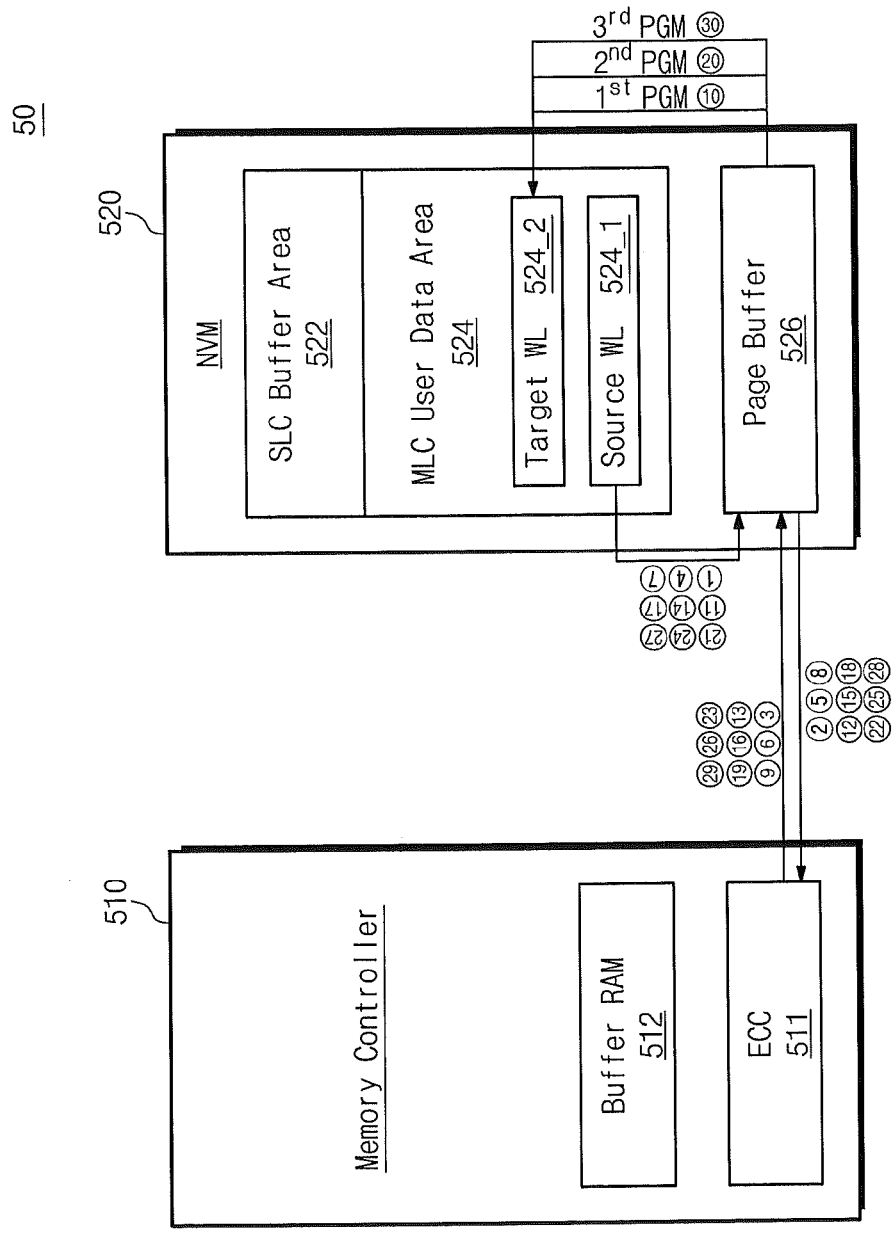
FIG. 14 is a block diagram illustrating another embodiment on a memory system using a block copy method illustrated in FIG. 12.

FIG. 14 is a block diagram illustrating another embodiment on a memory system using a block copy method illustrated in FIG. 12. First programming 1$^{st}$ PGM will be executed as follow. LSB, CSB, and MSB pages may be sequentially read from memory cells connected to a source word line 524_1, and the read LSB, CSB, and MSB pages may be error corrected. For example, the read LSB page may be stored in a page buffer 526 (①), and the LSB page stored in the page buffer 526 may be sent to an ECC circuit 511 (②). After error correction by the ECC circuit 511, the LSB page may be transferred to a page buffer 526 (③). The CSB page may be stored in the page buffer 526 in the same manner as described above (④, ⑤, ⑥), and the MSB page may be stored in the page buffer 526 in the same manner as described above (⑦, ⑧, ⑨). Thus, the error-corrected LSB, CSB, and MSB pages may be stored in the page buffer 526. The first programming 1$^{st}$ PGM may be performed using the LSB, CSB, and MSB pages stored in the page buffer 526 (⑩). Thus, the first programming 1$^{st}$ PGM may be ended. Second programming 2$^{nd}$ PGM may be executed according to address scrambling illustrated in FIG. 12 in a manner similar to the first programming 1$^{st}$ PGM (refer to 11 to 20 in circles). Thus, the second programming 2$^{nd}$ PGM may be ended. Third programming 3$^{rd}$ PGM may be executed according to address scrambling illustrated in FIG. 12 (21 to 30 in circles). Thus, the third programming 3$^{rd}$ PGM may be ended. As described above, data stored in memory cells connected to a source word line 524_1 may be reprogrammed at memory cells connected to a target word line 5242 by the 3-step PGM, programming 1$^{st}$ PGM, 2$^{nd}$ PGM, and 3$^{rd}$ PGM. For a block copy method of the inventive concept, whenever each programming is performed, data may be read and error corrected. Afterwards, reprogramming may be performed. With a block copy method illustrated in FIGS. 13 and 14, error correction may be made by a memory controller. However, the inventive concept is not limited thereto. For example, a block copy method of the inventive concept can perform error correction within a nonvolatile memory device.

Figure 15:
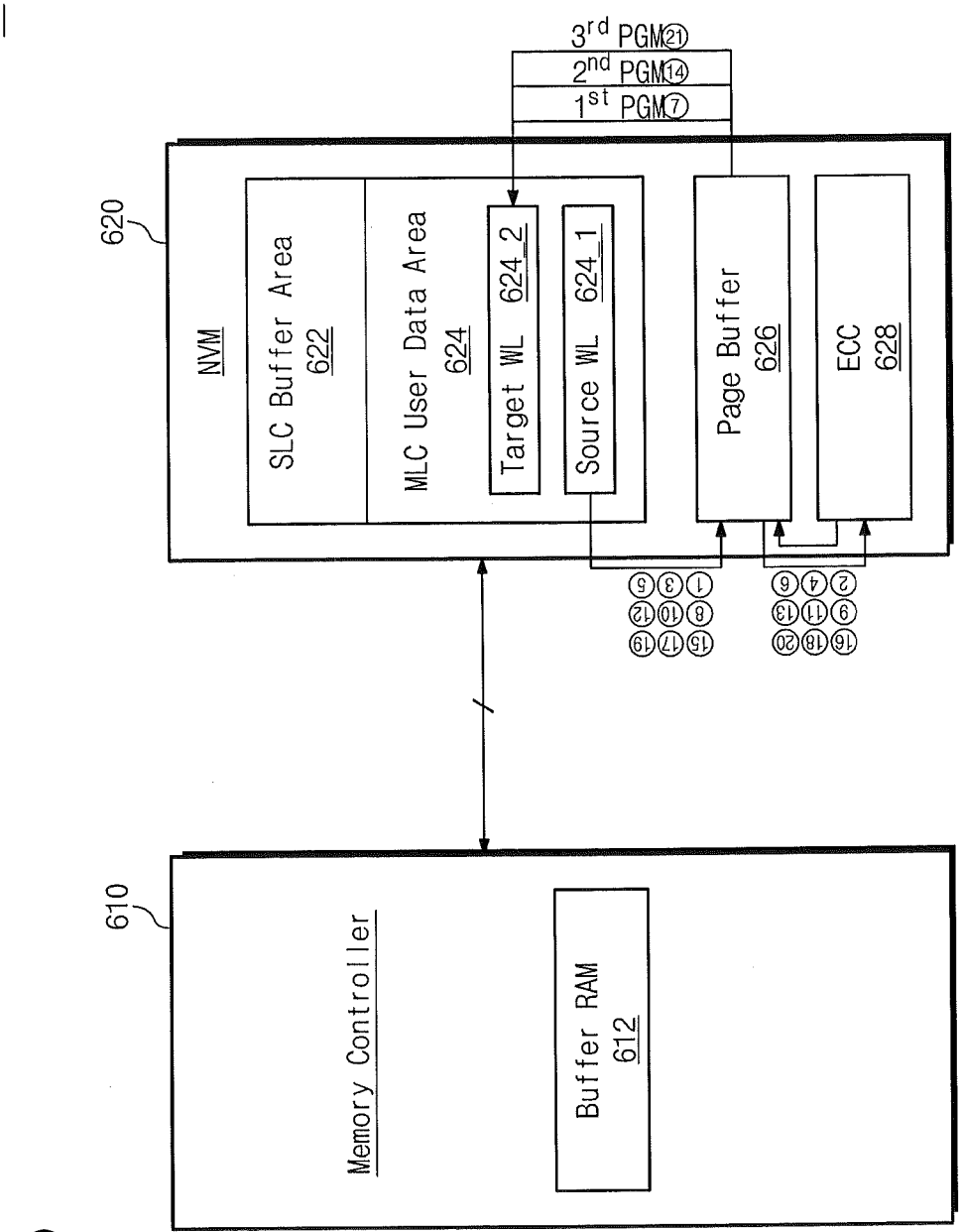
FIG. 15 is a block diagram illustrating still another embodiment on a memory system using a block copy method illustrated in FIG. 12.

FIG. 15 is a block diagram illustrating still another embodiment on a memory system using a block copy method illustrated in FIG. 12. A block copy method will be described with reference to FIG. 14. First programming may be performed as follows. An LSB page read from memory cells connected to a source word line 624_1 may be stored in a page buffer 626 (①). The read LSB page may be error corrected by an ECC circuit 628 of a nonvolatile memory device 620, and then the corrected LSB page may be stored in the page buffer 626 (②). A CSB page read from memory cells connected to the source word line 624_1 may be stored in the page buffer 626 (③). The read CSB page may be error corrected by the ECC circuit 628 of the nonvolatile memory device 620, and then the corrected CSB page may be stored in the page buffer 626 (④). An MSB page read from memory cells connected to the source word line 624_1 may be stored in the page buffer 626 (⑤). The read MSB page may be error corrected by the ECC circuit 628 of the nonvolatile memory device 620, and then the corrected MSB page may be stored in the page buffer 626 (⑥). With the above description, error-corrected LSB, CSB, and MSB pages may be stored in the page buffer 626. Afterwards, first programming 1$^{st}$ PGM may be executed using the LSB, CSB, and MSB pages stored in the page buffer 626 (⑦). Thus, the first programming 1$^{st}$ PGM on the source word line 624_1 may be completed. Second programming 2$^{nd}$ PGM may be performed according to address scrambling illustrated in FIG. 12 in a manner similar to the first programming 1$^{st}$ PGM (refer to 8 to 14 in circles). Third programming 3$^{rd}$ PGM may be performed according to the address scrambling illustrated in FIG. 12 in a manner similar to the first programming 1$^{st}$ PGM (refer to 15 to 21 in circles). With a block copy method of the inventive concept, whenever each programming is executed, data may be read, and the read data may be corrected within the nonvolatile memory device 620. Afterwards, reprogramming may be performed.

Figure 16:
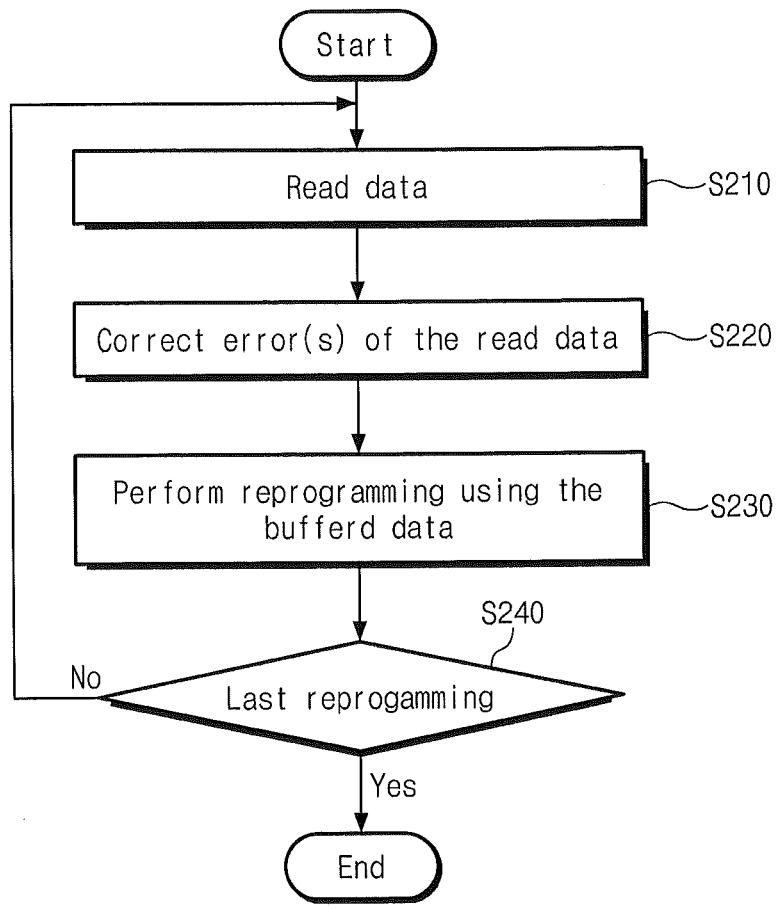
FIG. 16 is a flowchart describing a block copy method illustrated in FIG. 12.

FIG. 16 is a flowchart describing a block copy method illustrated in FIG. 12. Below, a block copy method will be more fully described with reference to FIGS. 12 to 16. In operation S210, data may be read from a source block. In operation S220, the read data may be error corrected. Herein, error correction may be made by an ECC circuit 411/511 (refer to FIG. 13 or 14) of a memory controller or by an ECC circuit 528 (refer to FIG. 15) of a nonvolatile memory device. In operation S230, reprogramming may be executed using the error-corrected data according to address scrambling illustrated in FIG. 12. In operation S240, whether reprogramming is the last step may be judged. If not, the method proceeds to operation S210. If so, the method may be ended. With a block copy method of the inventive concept, data may be read at each programming, the read data may be error corrected, and reprogramming may be made using error-corrected data. For a 3-bit program method executed according to reprogramming manners illustrated in FIGS. 1 to 16, 3-bit data may be programmed at first, second, and third programming $1^{st}$ PGM, $2^{nd}$ PGM, and $3^{rd}$ PGM, respectively. In other words, reprogramming may be performed in an 8-8-8 manner. However, the inventive concept is not limited thereto. A 3-bit program operation executed in a reprogramming manner of the inventive concept can be formed of first programming for programming 2-bit data and second and third programming $2^{nd}$ PGM and $3^{rd}$ PGM for programming 3-bit data.

Figure 17:
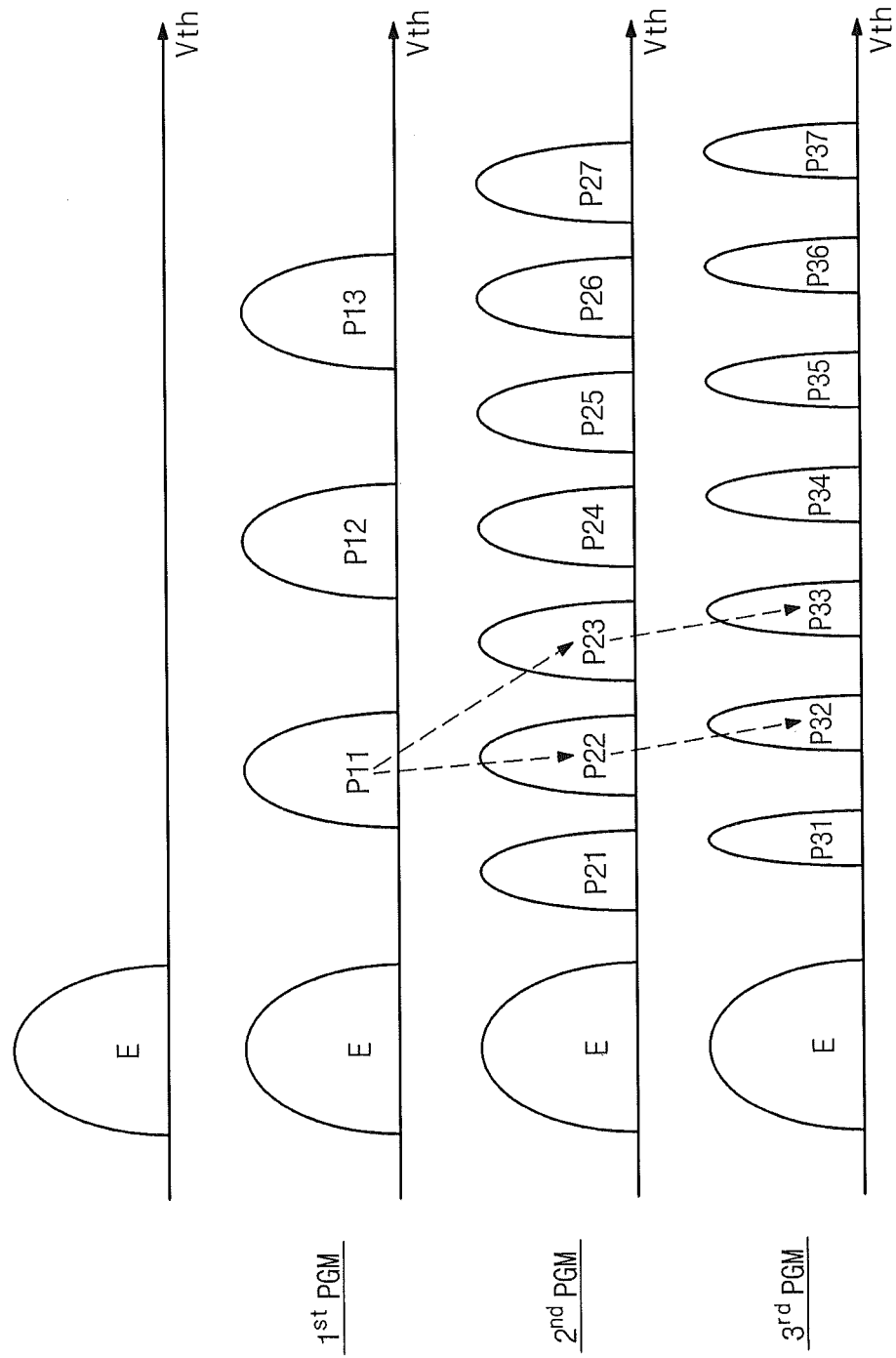
FIG. 17 is a diagram illustrating another embodiment on a 3-bit program operation executed in a reprogramming manner according to the inventive concept.

FIG. 17 is a diagram illustrating another embodiment on a 3-bit program operation executed in a reprogramming manner according to the inventive concept. Referring to FIG. 17, a 3-bit program operation may be executed using a 3-step reprogramming $1^{st}$ PGM, $2^{nd}$ PGM, and $3^{rd}$ PGM. Herein, a 2-bit program operation may be performed during the first programming $1^{st}$ PGM, and a 3-bit program operation may be performed during the second and third programming $2^{nd}$ PGM and $3^{rd}$ PGM. During the first programming $1^{st}$ PGM, an erase state E may be programmed to one, corresponding to 2-bit data, from among four states E and P11 to P13. That is, at the first programming $1^{st}$ PGM, first and second pages (e.g., an LSB page and a CSB page) may be programmed to 4-level states.

During the second programming $2^{nd}$ PGM, first, second, and third pages (e.g., LSB, CSB, and MSB pages) may be coarsely programmed to 8-level states using first programmed states P11 to P13. For example, a state P11 of the first programming $1^{st}$ PGM may be programmed to a state P22 or P23 of the second programming $2^{nd}$ PGM. During the third programming $3^{rd}$ PGM, second programmed states P21 to P27 may be finely reprogrammed to 8-level states P31 to P37. At the PGM, third programming $3^{rd}$ PGM, 3-bit data programmed at the second programming $2^{nd}$ PGM may be reprogrammed. For example, a state P21 of the second programming $2^{nd}$ PGM may be reprogrammed to a state P31 of the third programming $3^{rd}$ PGM. As a result, a threshold voltage distribution corresponding to the state P31 of the third programming $3^{rd}$ PGM may be narrower than that corresponding to the state P21 of the second programming $2^{nd}$ PGM. Thus, a final 3-bit program operation may be completed. A program operation illustrated in FIG. 17 may use reprogramming of a 4-8-8 manner. A 3-bit program operation according to the inventive concept may be executed in a reprogramming manner formed of three programming $1^{st}$ PGM, $2^{nd}$ PGM, and $3^{rd}$ PGM. At least one of the three programming $1^{st}$ PGM, $2^{nd}$ PGM, and $3^{rd}$ PGM may perform a different bit program operation.

Figure 18:
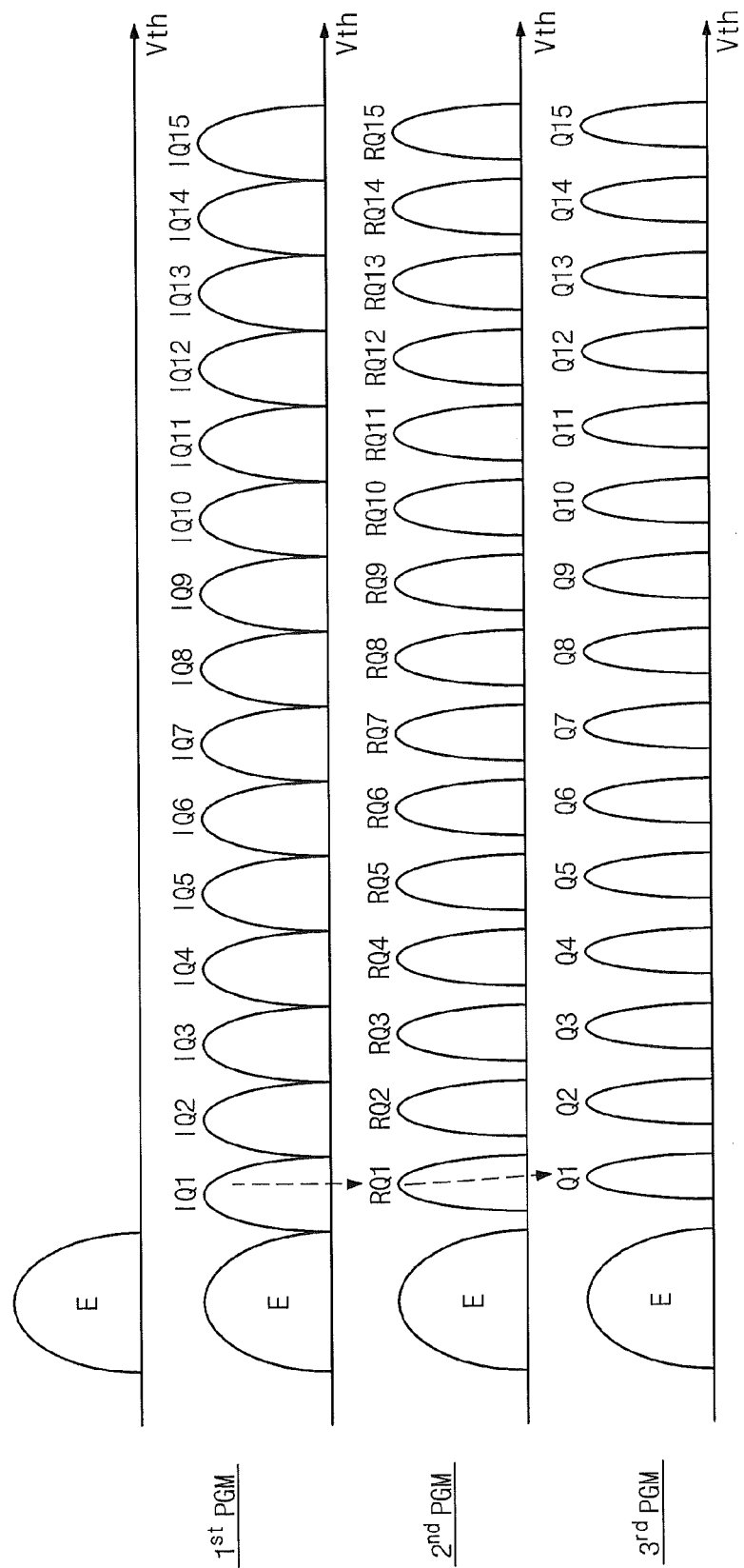
FIG. 18 is a diagram illustrating an embodiment on a 4-bit program operation executed in a reprogramming manner according to the inventive concept.

FIG. 18 is a diagram illustrating an embodiment on a 4-bit program operation executed in a reprogramming manner according to the inventive concept. Referring to FIG. 18, a 4-bit program operation may be executed in a reprogramming manner formed of three programming $1^{st}$ PGM, $2^{nd}$ PGM, and $3^{rd}$ PGM. Herein, each programming may include the same 4-bit program operation (or, a 16-level program operation).

A nonvolatile memory device in each memory system illustrated in FIGS. 1 to 18 may include a user data area and an SLC buffer area. However, the inventive concept is not limited thereto. A memory system according to the inventive concept can be implemented such that a nonvolatile memory device having an SLC buffer area for a buffer program operation is further provided.

Figure 19:
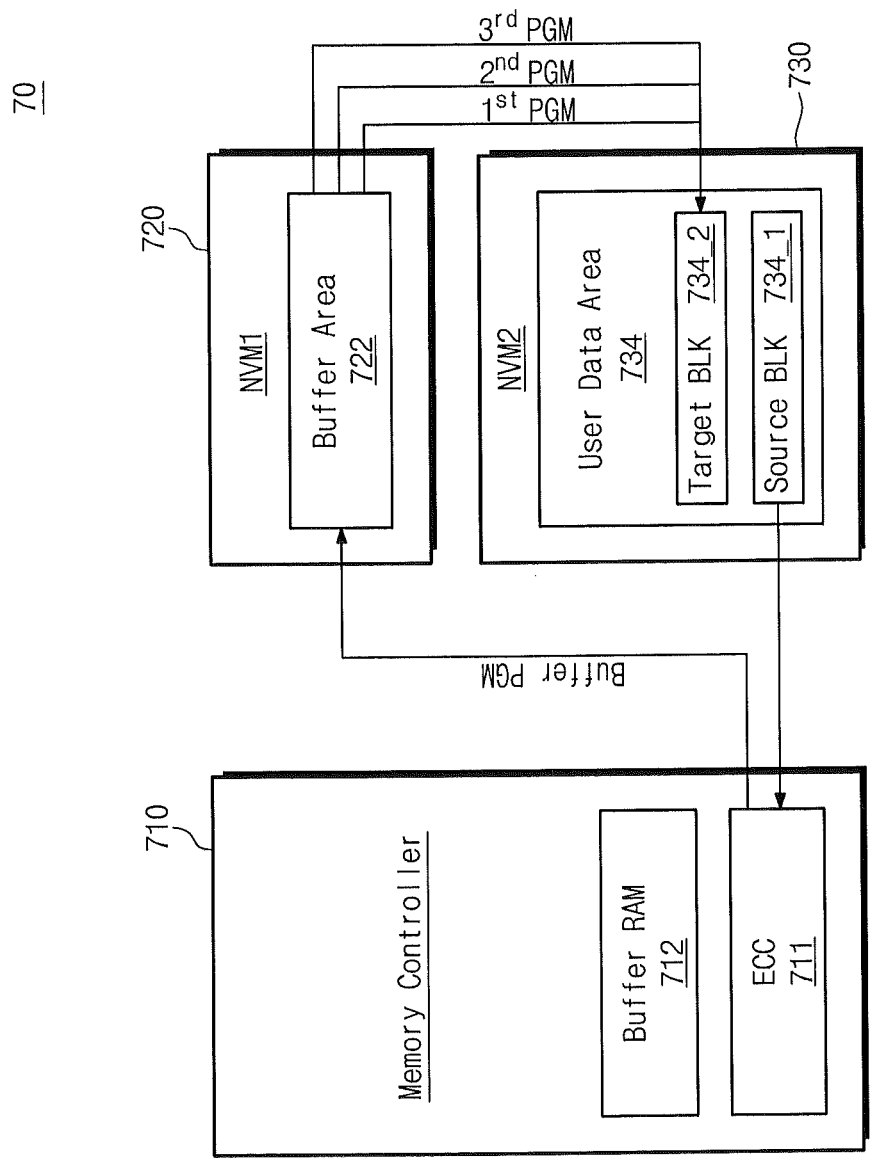
FIG. 19 is a diagram conceptually illustrating a block copy method in another embodiment on a memory system executing a multi-bit program operation.

FIG. 19 is a diagram conceptually illustrating a block copy method in another embodiment on a memory system executing a multi-bit program operation. Referring to FIG. 19, a memory system 70 may include at least one first nonvolatile memory device 720 having an SLC buffer area 722 and at least one second nonvolatile memory device 730 having a user data area 734.

Below, a block copy method executed in a reprogramming manner of a user data area 734 illustrated in FIG. 19 will be more fully described. First, data read from a source block 743_1 may be corrected by an ECC circuit 711, and the error-corrected data may be buffer programmed at the SLC buffer area 722 of the SLC nonvolatile memory device 720. Afterwards, data stored in the SLC buffer area 722 may be programmed at a target block 734_2 according to predetermined address scrambling. At this time, reprogramming may be performed according to three programming $1^{st}$ PGA $2^{nd}$ PGM, and $3^{rd}$ PGM. If the memory system 70 executes a 3-bit program operation, the programming $1^{st}$ PGM, $2^{nd}$ PGM, and $3^{rd}$ PGM may be executed in a 4-8-8 manner or an 8-8-8 manner. With a block copy method of the inventive concept, data to be programmed may be buffered by the first nonvolatile memory device 720, and the buffered data may be programmed at the target block 7342 of the second nonvolatile memory device 730 in a reprogramming manner. In FIG. 19, the source block 734_1 and the target block 734_2 may be included within the same nonvolatile memory device. However, the inventive concept is not limited thereto. Source and target blocks can be included within different nonvolatile memory devices.

Figure 20:
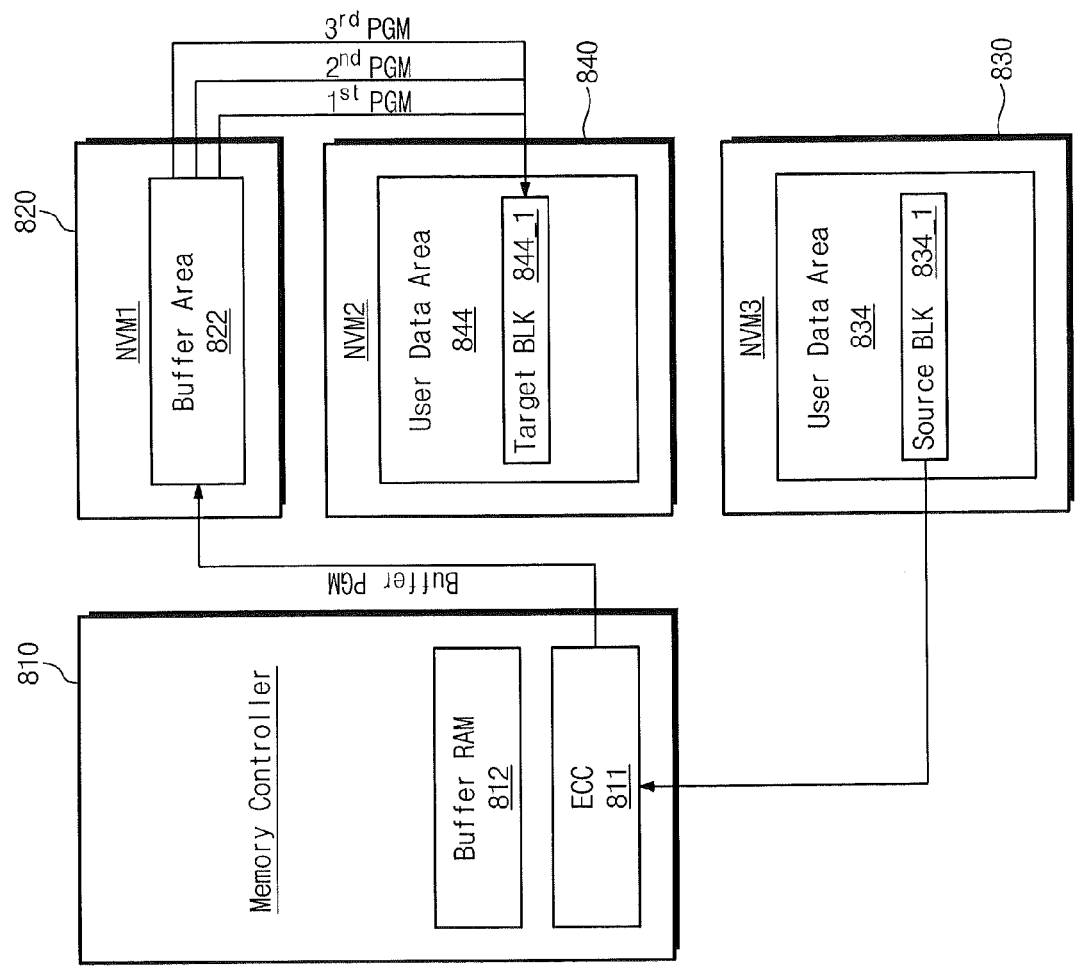
FIG. 20 is a diagram conceptually illustrating a block copy method in still another embodiment on a memory system executing a multi-bit program operation.

FIG. 20 is a diagram conceptually illustrating a block copy method in still another embodiment on a memory system executing a multi-bit program operation. Referring to FIG. 20, a memory system 80 may include at least one first nonvolatile memory device 820 having an SLC buffer area 822, a second nonvolatile memory device 830 having a source block 834_1, and a third nonvolatile memory device 840 having a target block 844_1. Below, a block copy method executed in a reprogramming manner illustrated in FIG. 20 will be more fully described. First, data read from a source block 843_1 of the second nonvolatile memory device 830 may be corrected by an ECC circuit 811, and the error-corrected data may be buffer programmed at the SLC buffer area 822 of the first nonvolatile memory device 820. Afterwards, data stored in the SLC buffer area 822 may be programmed at a target block 844_1 of the second nonvolatile memory device 840 according to predetermined address scrambling. At this time, reprogramming may be performed according to three programming $1^{st}$ PGM, $2^{nd}$ PGM, and $3^{rd}$ PGM. With a block copy method of the inventive concept, data of the second nonvolatile memory device 830 may be buffered by the first nonvolatile memory device 820, and the buffered data may be programmed at the third nonvolatile memory device 840 in a reprogramming manner. In FIG. 20, a nonvolatile memory device 820 buffering data may be different from a nonvolamemory device 840 to be reprogrammed. However, the inventive concept is not limited thereto. A nonvolatile memory device buffering data can be equal to a nonvolatile memory device to be reprogrammed.

Figure 21:
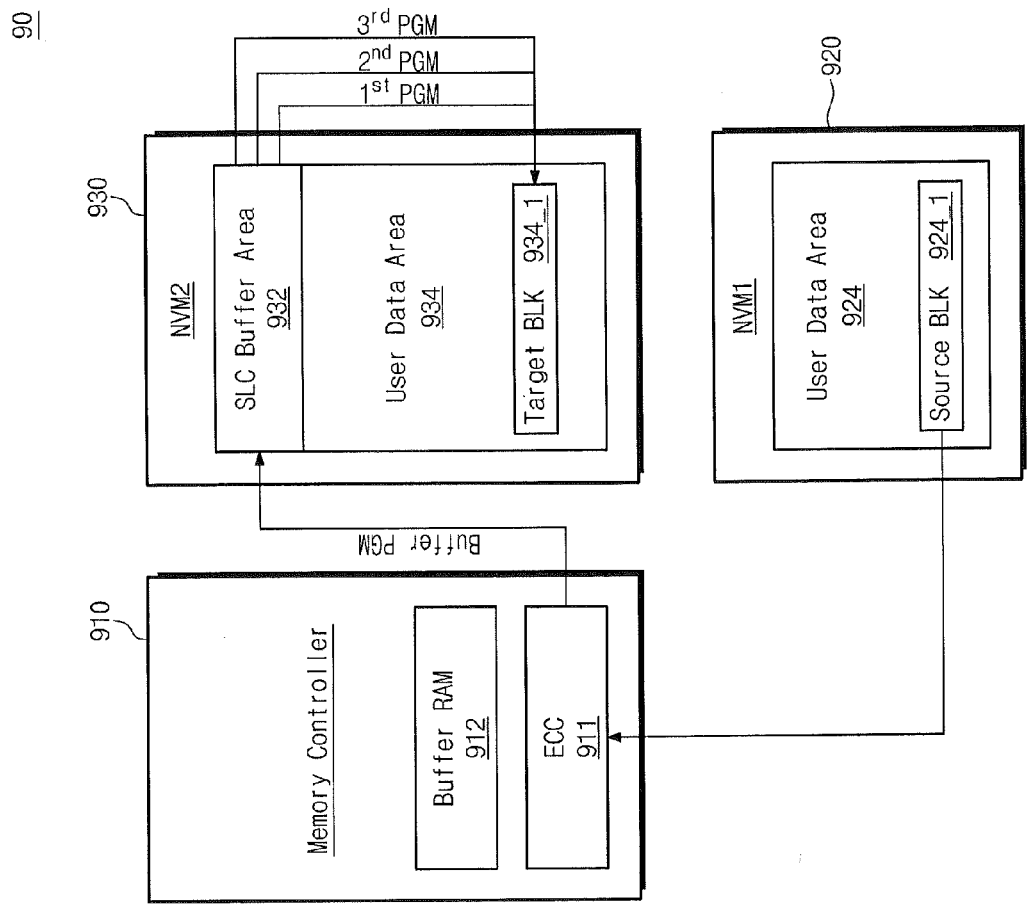
FIG. 21 is a diagram conceptually illustrating a block copy method in still another embodiment on a memory system executing a multi-bit program operation.

FIG. 21 is a diagram conceptually illustrating a block copy method in still another embodiment on a memory system executing a multi-bit program operation. Referring to FIG. 21, a memory system 90 may include a first nonvolatile memory device 920 having a source block 924_1 and a second nonvolatile memory device 930 having an SLC buffer area 932 and a target block 934_1. Below, a block copy method executed in a reprogramming manner illustrated in FIG. 21 will be more fully described. First, data read from a source block 924_1 of the first nonvolatile memory device 920 may be corrected by an ECC circuit 911, and the error-corrected data may be buffer programmed at the SLC buffer area 932 of the second nonvolatile memory device 930. Afterwards, data stored in the SLC buffer area 822 may be programmed at a target block 934_1 of the second nonvolatile memory device 930 according to predetermined address scrambling. At this time, reprogramming may be performed according to three programming $1^{st}$ PGM, $2^{nd}$ PGM, and $3^{rd}$ PGM. With a block copy method of the inventive concept, data of the first nonvolatile memory device 920 may be buffered by the SLC buffer area 932 of the second nonvolatile memory device 930, and the buffered data may be programmed at a user data area 934 of the second nonvolatile memory device 930 in a reprogramming manner. A block copy method according to an embodiment of the inventive concept is applicable to a memory system having a Vertical NAND (VNAND).

Figure 22:
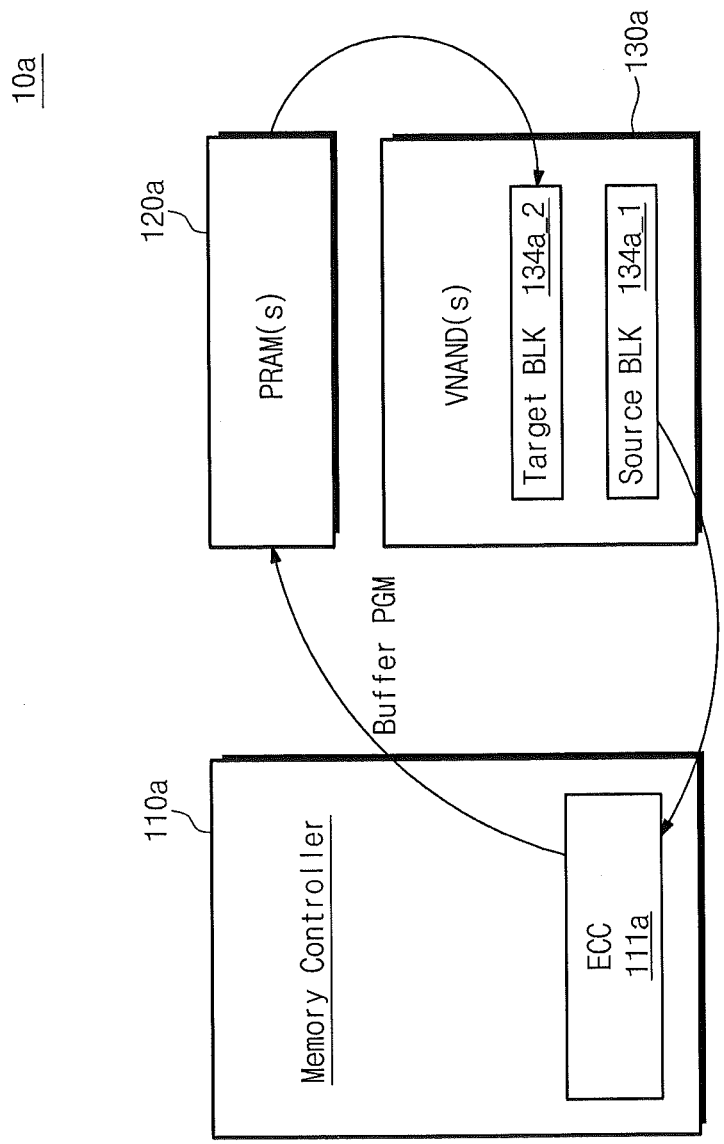
FIG. 22 is a block diagram schematically illustrating a memory system including a vertical NAND performing a block copy operation according to the inventive concept.

FIG. 22 is a block diagram schematically illustrating a memory system including a vertical NAND performing a block copy operation according to the inventive concept. Referring to FIG. 22, a memory system 10a may include a memory controller 110a, at least one Phase-change RAM (PRAM) 120a, and at least one vertical NAND (VNAND) 130a. The PRAM 120a may include memory cells that store data according to a state (a crystalline state or an amorphous state) of a phase change material. Examples of the PRAM 120a are disclosed in U.S. Pat. Nos. 7,085,154, 7,227,776, 7,304,886, and 8,040,720, the entirety of which is incorporated by reference herein. Examples of the VNAND 130a are disclosed in U.S. Patent Publication Nos. 2009/0310415, 2010/0078701, 2010/0117141, 2010/0140685, 2010/0213527, 2010/0224929, 2010/0315875, 2010/0322000, 2011/0013458, and 2011/0018036, the entirety of which is incorporated by reference herein.

Below, an operation of copying data of a source block 134a_1 to a target block 134a_2 will be described. Data may be read from the source block 134a_1, the read data may be corrected by an ECC circuit 111a, and the error-corrected data may be buffer programmed in the PRAM 120a. Afterwards, the buffer programmed data may be programmed in the target block 134a_2 of the VNAND 130a. Herein, a reprogramming manner may be used selectively when the buffer programmed data is programmed at the target block 134a_2. That is, the buffer programmed data is programmed at the target block 134a_2 using a reprogramming manner or without using a reprogramming manner. With a block copy method of a memory system 10a of the inventive concept, data read from the source block 134a_1 of the VNAND 130a may be buffered by the PRAM 120a, and the buffered data may be programmed at the target block 134a_2 of the VNAND 130a.

Figure 23:
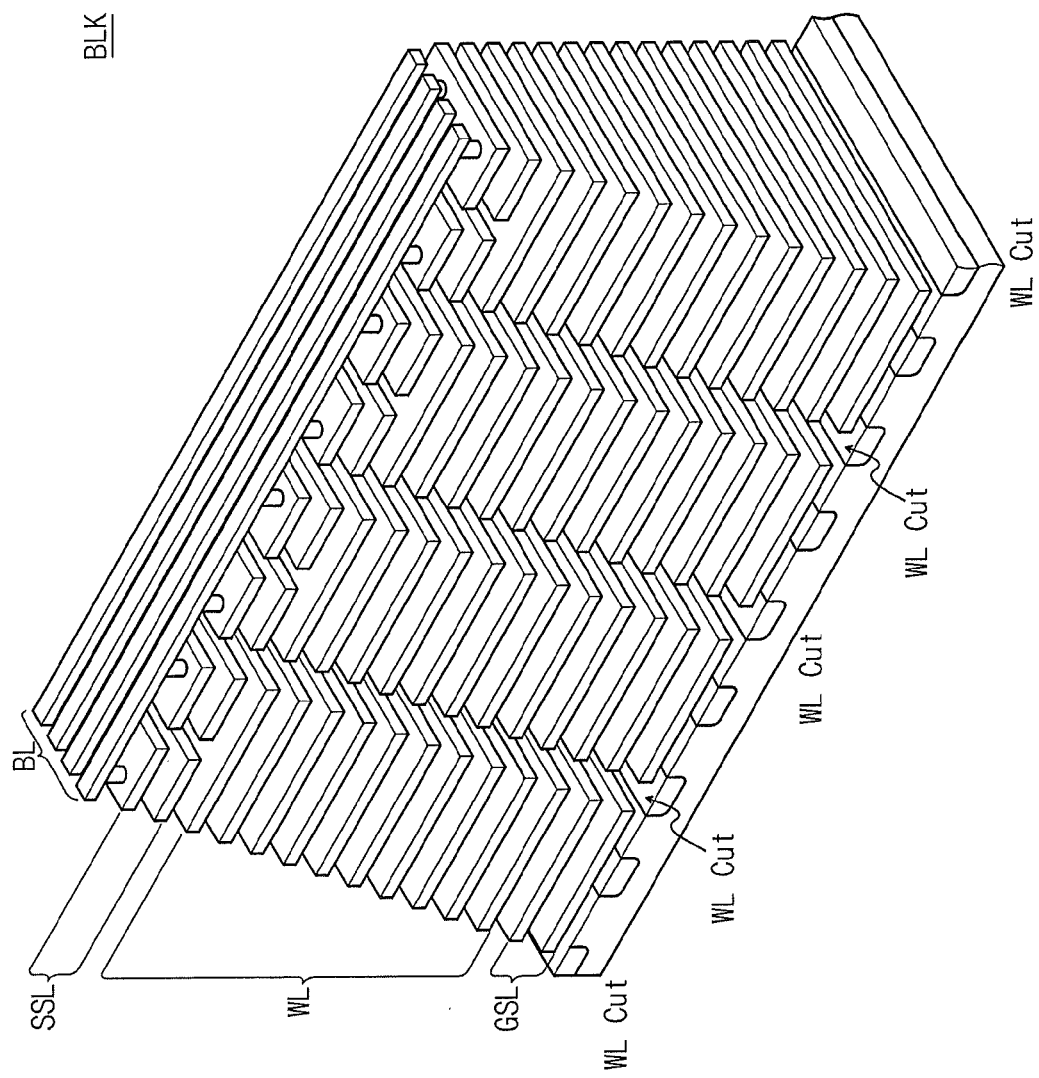
FIG. 23 is a diagram schematically illustrating one block of VNAND illustrated in FIG. 22.

FIG. 23 is a diagram schematically illustrating one block of VNAND illustrated in FIG. 22. Referring to FIG. 23, four sub blocks on a substrate may constitute a block. Each sub block may be formed by stacking one ground selection line GSL, a plurality of word lines WL, and at least one string selection line SSL between word line cuts. Herein, the at least one string selection line SSL may be separated by a string selection line cut. Although not shown in FIG. 23, each word line cut may include a common source line CSL. In example embodiments, common source lines CSL included within word line cuts may be connected in common. The inventive concept is applicable to various devices.

Figure 24:
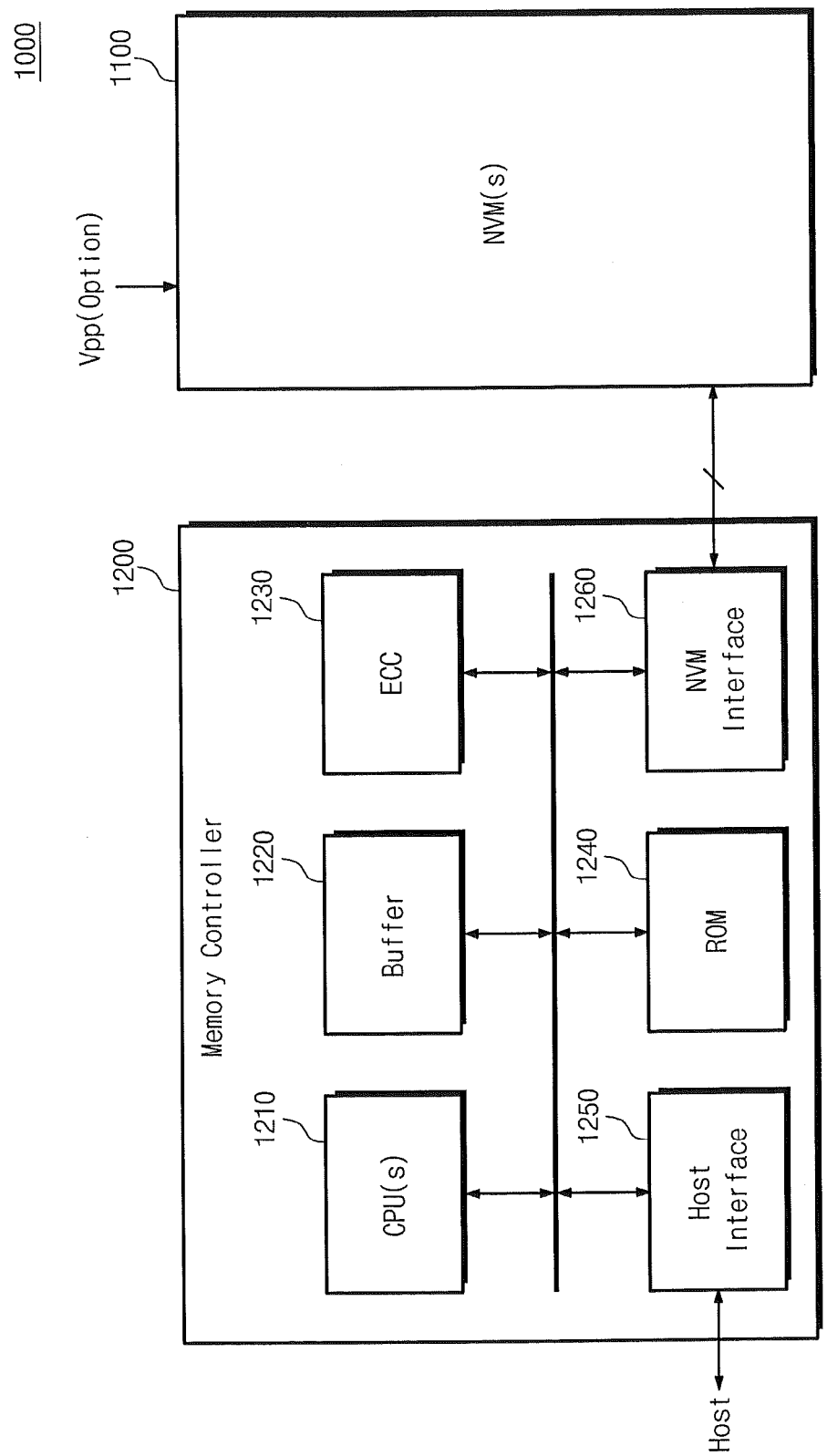
FIG. 24 is a block diagram schematically illustrating a memory system according to an embodiment of the inventive concept.

FIG. 24 is a block diagram schematically illustrating a memory system according to an embodiment of the inventive concept. Referring to FIG. 24, a memory system 1000 may include at least one nonvolatile memory device 1100 and a memory controller 1200. A block copy method executed in a reprogramming manner described in relation to FIGS. 1 to 23 may be applied to the memory system 1000. The nonvolatile memory device 1100 may be optionally supplied with a high voltage Vpp from the outside. The memory controller 1200 may be connected with the nonvolatile memory device 1100 via a plurality of channels. The memory controller 1200 may include at least one Central Processing Unit (CPU) 1210, a buffer memory 1220, an ECC circuit 1230, a Read-Only Memory (ROM) 1240, a host interface 1250, and a memory interface 1260. Although not shown in FIG. 24, the memory controller 1200 may further comprise a randomization circuit that randomizes and de-randomizes data. The memory system 1000 according to an embodiment of the inventive concept is applicable to a perfect page new (PPN) memory. Detailed description of the memory system is disclosed in U.S. Pat. No. 8,027,194 and U.S. Patent Publication No. 2010/0082890, the entirety of which is incorporated by reference herein.

Figure 25:
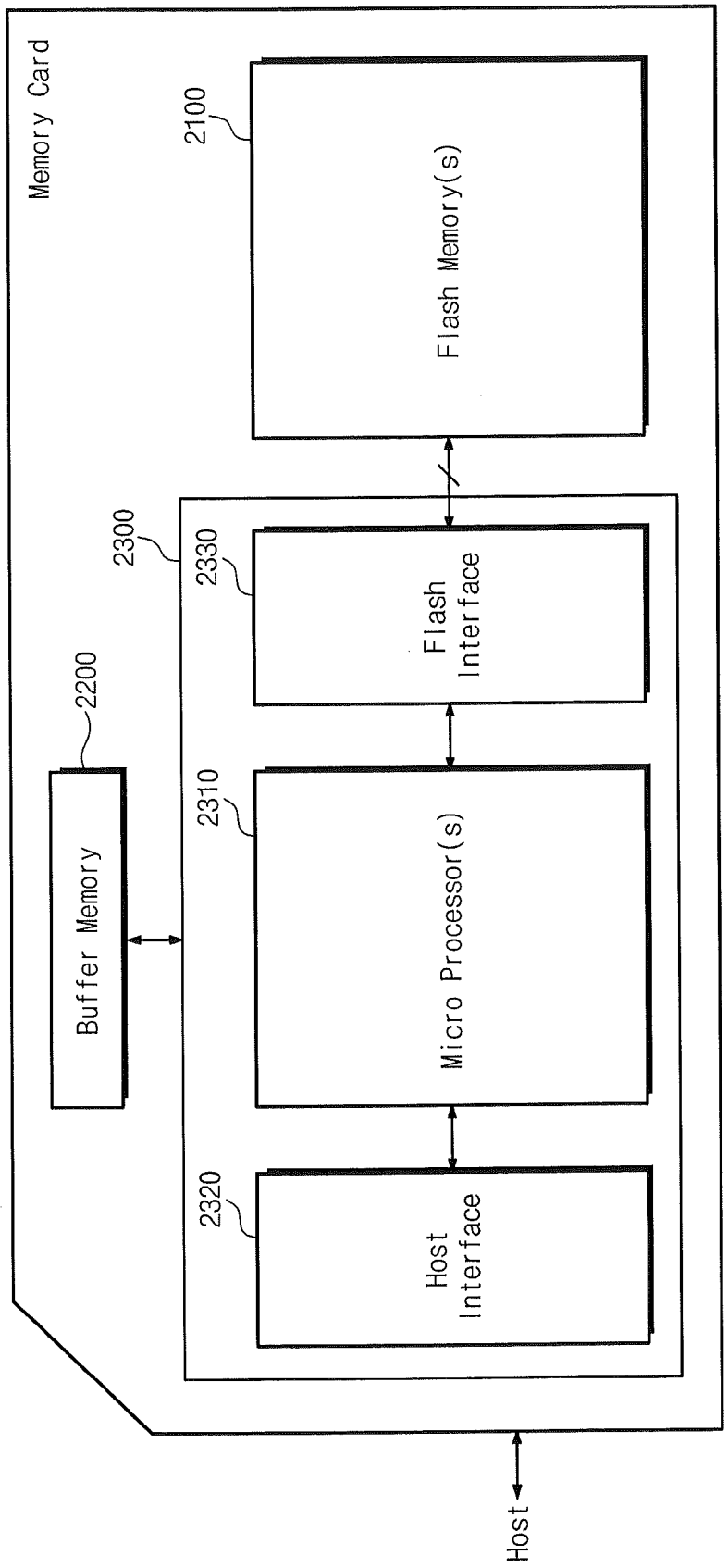
FIG. 25 is a block diagram schematically illustrating a memory card according to an embodiment of the inventive concept.

FIG. 25 is a block diagram schematically illustrating a memory card according to an embodiment of the inventive concept. Referring to FIG. 25, a memory card 2000 may include at least one flash memory device 2100, a buffer memory device 2200, and a memory controller 2300 for controlling the flash memory 2100 and the buffer memory 2200. A block copy method executed in a reprogramming manner described in relation to FIGS. 1 to 23 may be applied to the memory card 2000. The buffer memory device 2200 may be used to temporarily store data generated during the operation of the memory card 2000. The buffer memory device 2200 may be implemented using a DRAM or an SRAM. The memory controller 2300 may be connected to the flash memory device 2100 via a plurality of channels. The memory controller 2300 may be connected between a host and the flash memory 2100. The memory controller 2300 may be configured to access the flash memory 2100 in response to a request from the host. The memory controller 2300 may include at least one microprocessor 2310, a host interface 2320, and a flash interface 2330. The at least one microprocessor 2310 may be configured to drive firmware. The host interface 2320 may interface with the host via a card protocol (e.g., SD/MMC) for data exchanges between the host and the memory interface 2330. The memory card 2000 may be applicable to Multimedia Cards (MMCs), Security Digitals (SDs), miniSDs, memory sticks, smartmedia, and transflash cards. Detailed description of the memory card 2000 is disclosed in U.S. Patent Publication No. 2010/0306583, the entirety of which is incorporated by reference herein.

Figure 26:
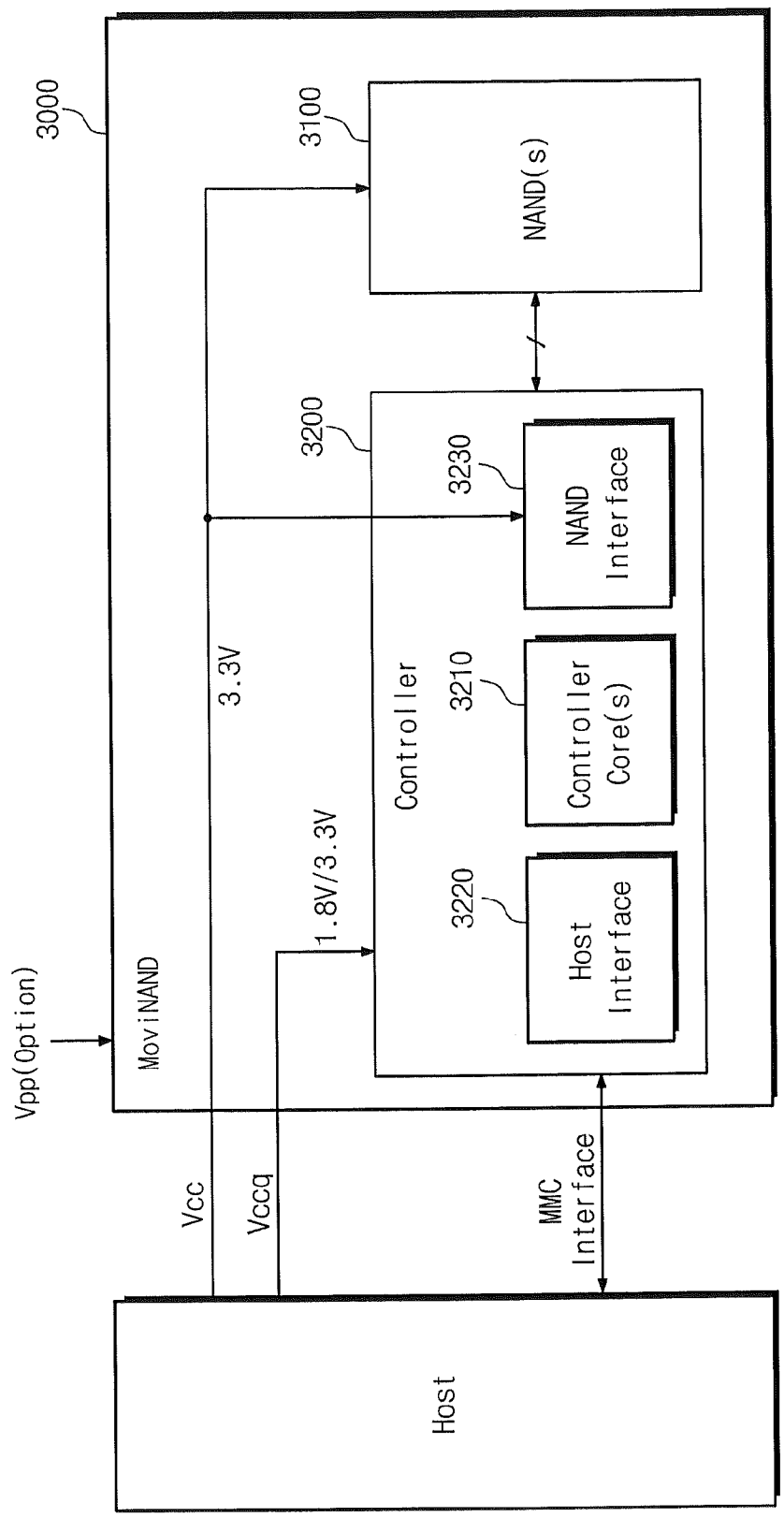
FIG. 26 is a block diagram schematically illustrating a moviNAND according to an embodiment of the inventive concept.

FIG. 26 is a block diagram schematically illustrating a moviNAND according to an embodiment of the inventive concept. Referring to FIG. 26, a moviNAND device 3000 may include at least one NAND flash memory device 3100 and a controller 3200. The moviNAND device 3000 may support the MMC 4.4 (called eMMC) standard. A block copy method executed in a reprogramming manner described in relation to FIGS. 1 to 23 may be applied to the moviNAND device 3000.

The NAND flash memory device 3100 may be optionally supplied with a high voltage Vpp from the outside. The NAND flash memory device 3100 may be a Single Data Rate (SDR) or Double Data Rate (DDR) NAND flash memory device. In example embodiments, the NAND flash memory device 3100 may include unitary NAND flash memory devices. Herein, unitary NAND flash memory devices may be stacked within a package (e.g., Fine-pitch Ball Grid Array (FBGA)).

The memory controller 3200 may be connected to the flash memory device 3100 via a plurality of channels CH1 to CH4. However, the number of channels is not limited thereto. The controller 3200 may include at least one controller core 3210, a host interface 3220, and a NAND interface 3230. The controller core 3210 may control an overall operation of the moviNAND device 3000.

The host interface 3220 may provide an interface between the controller 3210 and a host. The NAND interface 3230 may be configured to interface between the NAND flash memory device 3100 and the controller 3200. In example embodiments, the host interface 3220 may be a parallel interface (e.g., an MMC interface). In other example embodiments, the host interface 3220 of the moviNAND 3000 may be a serial interface (e.g., UHS-II or UFS interface).

The moviNAND device 3000 may receive power supply voltages Vcc and Vccq from the host. Herein, the power supply voltage Vcc (about 3.3V) may be supplied to the NAND flash memory device 3100 and the NAND interface 3230, while the power supply voltage Vccq (about 1.8V/3.3V) may be supplied to the controller 3200. In example embodiments, the moviNAND 3000 may be optionally supplied with a high voltage Vpp from the outside. The moviNAND 3000 according to an embodiment of the inventive concept may be advantageous to store mass data as well as may have an improved read characteristic. The moviNAND 3000 according to an embodiment of the inventive concept is applicable to small and low-power mobile products (e.g., a Galaxy S, iPhone, etc.).

The moviNAND 3000 in FIG. 26 may be provided with a plurality of power supply voltages Vcc and Vccq. However, the inventive concept is not limited thereto. The moviNAND of the inventive concept can be implemented to generate a power supply voltage (e.g., 3.3V) suitable for a NAND interface and a NAND flash memory by internally boosting or regulating an input power supply voltage Vcc. This technique is disclosed in U.S. Pat. No. 7,092,308, the entirety of which is incorporated by reference herein. The inventive concept is applicable to a Solid State Drive (SSD).

Figure 27:
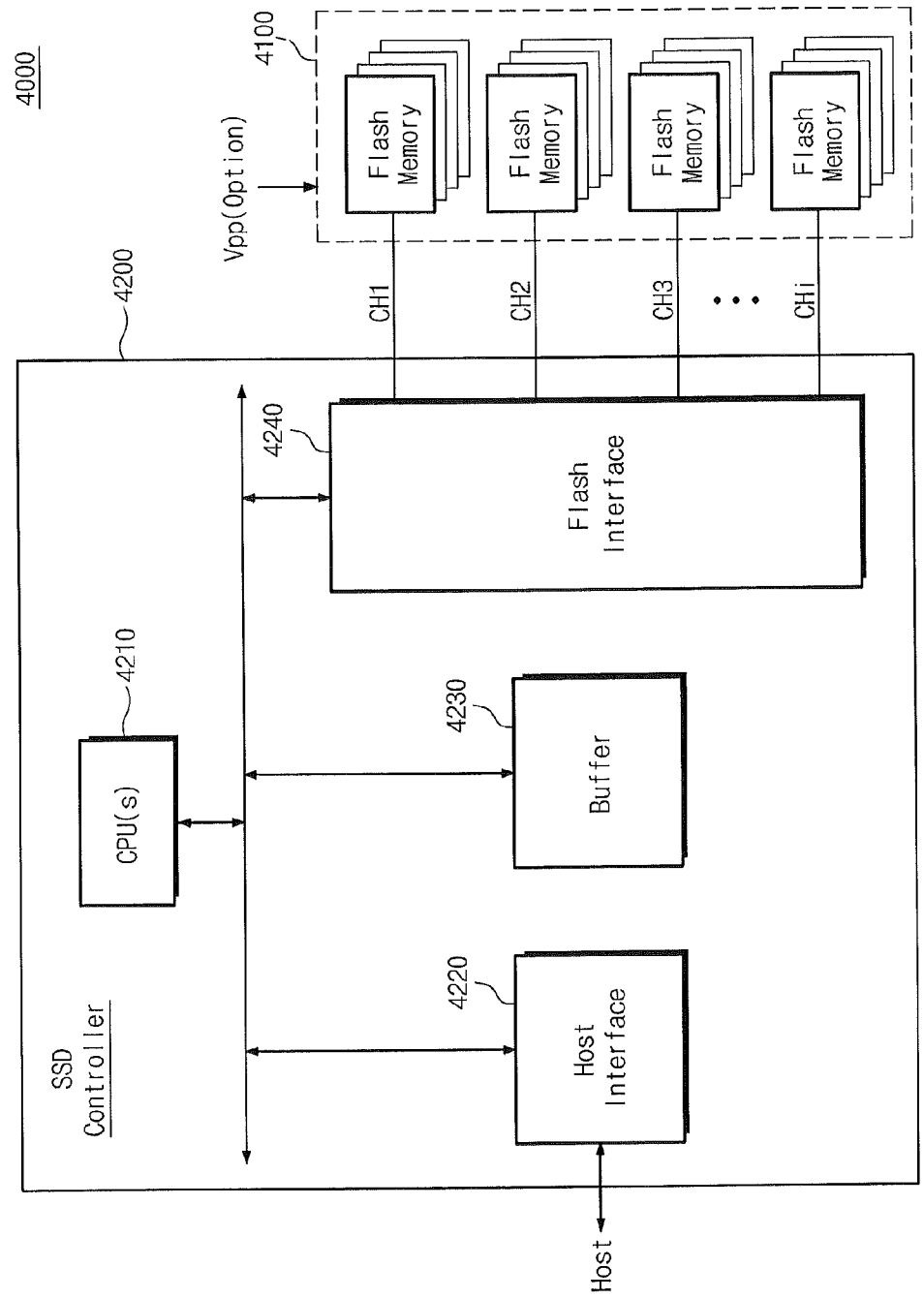
FIG. 27 is a block diagram of an SSD according to an embodiment of the inventive concept.

FIG. 27 is a block diagram of an SSD according to an embodiment of the inventive concept. Referring to FIG. 27, an SSD 4000 may include a plurality of flash memory devices 4100 and an SSD controller 4200. A block copy method executed in a reprogramming manner described in relation to FIGS. 1 to 23 may be applied to the SSD 4000.

The flash memory devices 4100 may be optionally supplied with a high voltage Vpp from the outside. The SSD controller 4200 may be connected to the flash memory devices 4100 via a plurality of channels CH1 to CHi (i being an integer of 2 or more). The SSD controller 4200 may include at least one CPU 4210, a host interface 4220, a buffer memory 4230, and a flash interface 4240.

Under the control of the CPU 4210, the host interface 4220 may exchange data with a host through the communication protocol. In example embodiments, the communication protocol may include the Advanced Technology Attachment (ATA) protocol. The ATA protocol may include a Serial Advanced Technology Attachment (SATA) interface, a Parallel Advanced Technology Attachment (PATA) interface, an External SATA (ESATA) interface, and the like. in other example embodiments, the communication protocol may include the Universal Serial Bus (UBS) protocol. Data to be received or transmitted from or to the host through the host interface 4220 may be delivered through the buffer memory 4230 without passing through a CPU bus, under the control of the CPU 4210.

The buffer memory 4230 may be used to temporarily store data transferred between an external device and the flash memory devices 4100. The buffer memory 4230 can be used to store programs to be executed by the CPU 4210. The buffer memory 4230 may be implemented using an SRAM or a DRAM. The buffer memory 4230 in FIG. 27 may be included within the SSD controller 4200. However, the inventive concept is not limited thereto. The buffer memory 4230 according to an embodiment of the inventive concept can be provided at the outside of the SSD controller 4200.

The flash interface 4240 may be configured to interface between the SSD controller 4200 and the flash memory devices 4100 that are used as storage devices. The flash interface 4240 may be configured to support NAND flash memories, One-NAND flash memories, multi-level flash memories, or single-level flash memories. The SSD 4000 according to an embodiment of the inventive concept may improve the integrity of data by storing random data at a program operation. Thus, the SSD 4000 may improve the integrity of stored data. More detailed description of the SSD 4000 is disclosed in U.S. Pat. No. 8,027,194 and U.S. Patent Publication No. 2010/0082890, the entirety of which is incorporated by reference herein.

Figure 28:
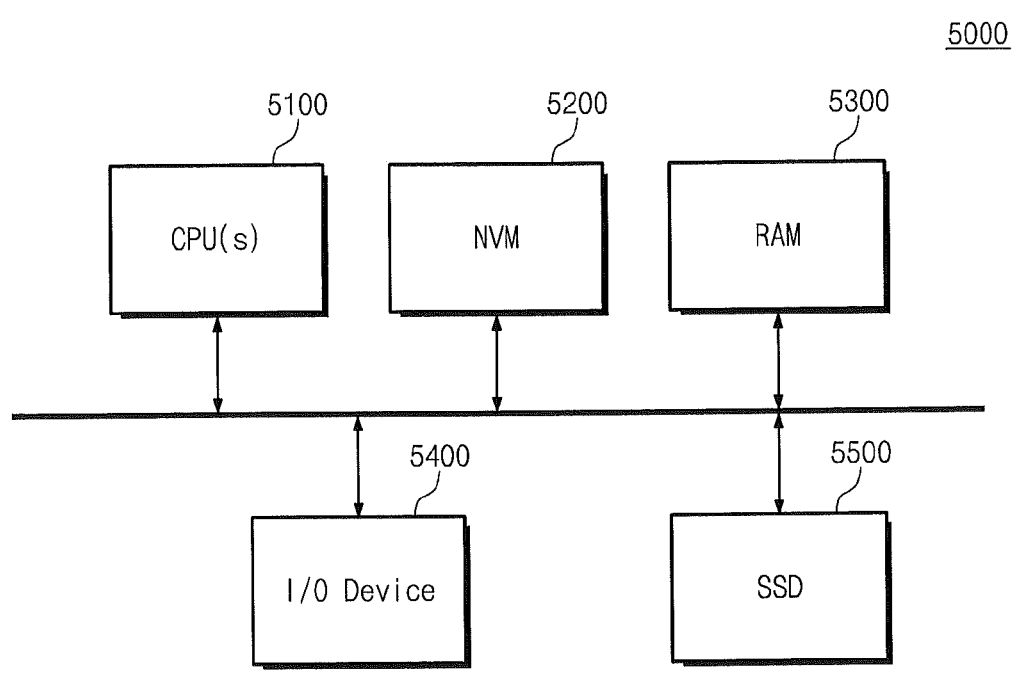
FIG. 28 is a block diagram schematically illustrating a computing system including an SSD in FIG. 27 according to an embodiment of the inventive concept.

FIG. 28 is a block diagram schematically illustrating a computing system including an SSD in FIG. 27 according to an embodiment of the inventive concept. Referring to FIG. 28, a computing system 5000 may include at least one CPU 5100, a nonvolatile memory device 5200, a RAM 5300, an input/output (I/O) device 5400, and at least one SSD 5500. The CPU 5100 may be connected to a system bus. The nonvolatile memory device 5200 may store data used to drive the computing system 5000. Herein, the data may include a start command sequence or a basic I/O system (BIOS) sequence. The RAM 5300 may temporarily store data generated during the execution of the CPU 5100. The I/O device 5400 may be connected to the system bus through an I/O device interface such as keyboards, pointing devices (e.g., mouse), monitors, modems, and the like. The SSD 5500 may be a readable storage device and may be implemented the same as the SSD 4000 of FIG. 27.

Figure 29:
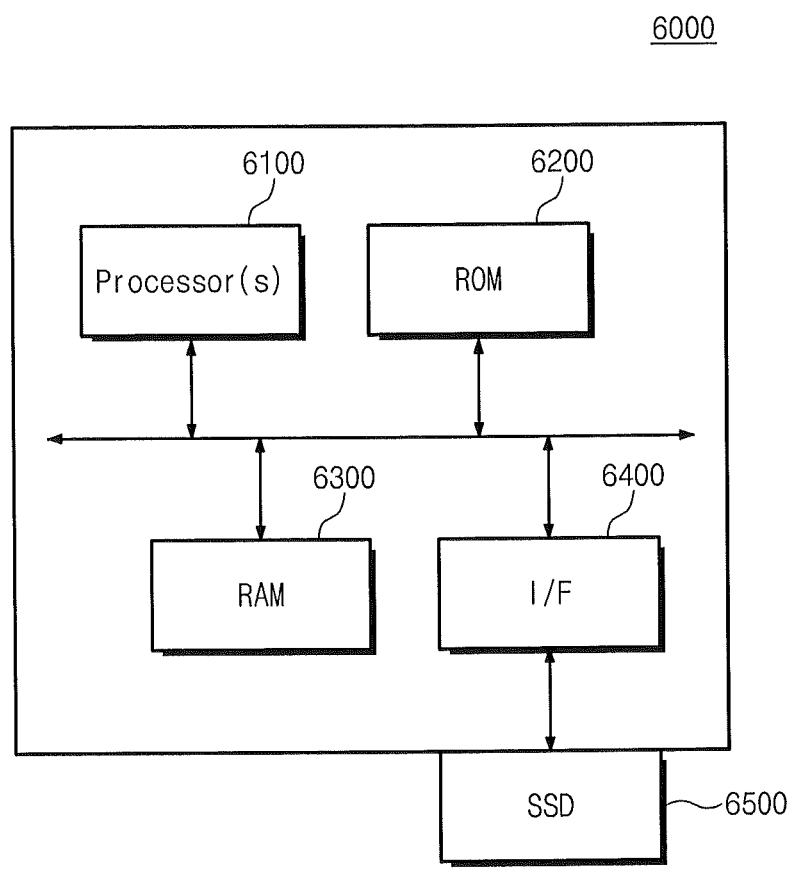
FIG. 29 is a block diagram schematically illustrating an electronic device including an SSD in FIG. 27 according to an embodiment of the inventive concept.

FIG. 29 is a block diagram schematically illustrating an electronic device including an SSD in FIG. 27 according to an embodiment of the inventive concept. Referring to FIG. 29, an electronic device 6000 may include a processor 6100, a ROM 6200, a RAM 6300, a flash interface 6400, and at least one SSD 6500. The processor 6100 may access the RAM 6300 to execute firmware codes or other codes. Also, the processor 6100 may access the ROM 6200 to execute fixed command sequences such as a start command sequence and a basic I/O system (BIOS) sequence. The flash interface 6400 may be configured to interface between the electronic device 6000 and the SSD 6500. The SSD 6500 may be detachable from the electronic device 6000. The SSD 6500 may be implemented the same as the SSD 4000 of FIG. 27. The electronic device 6000 may include cellular phones, personal digital assistants (PDAs), digital cameras, camcorders, portable audio players (e.g., MP3), and portable media players (PMPs).

Figure 30:
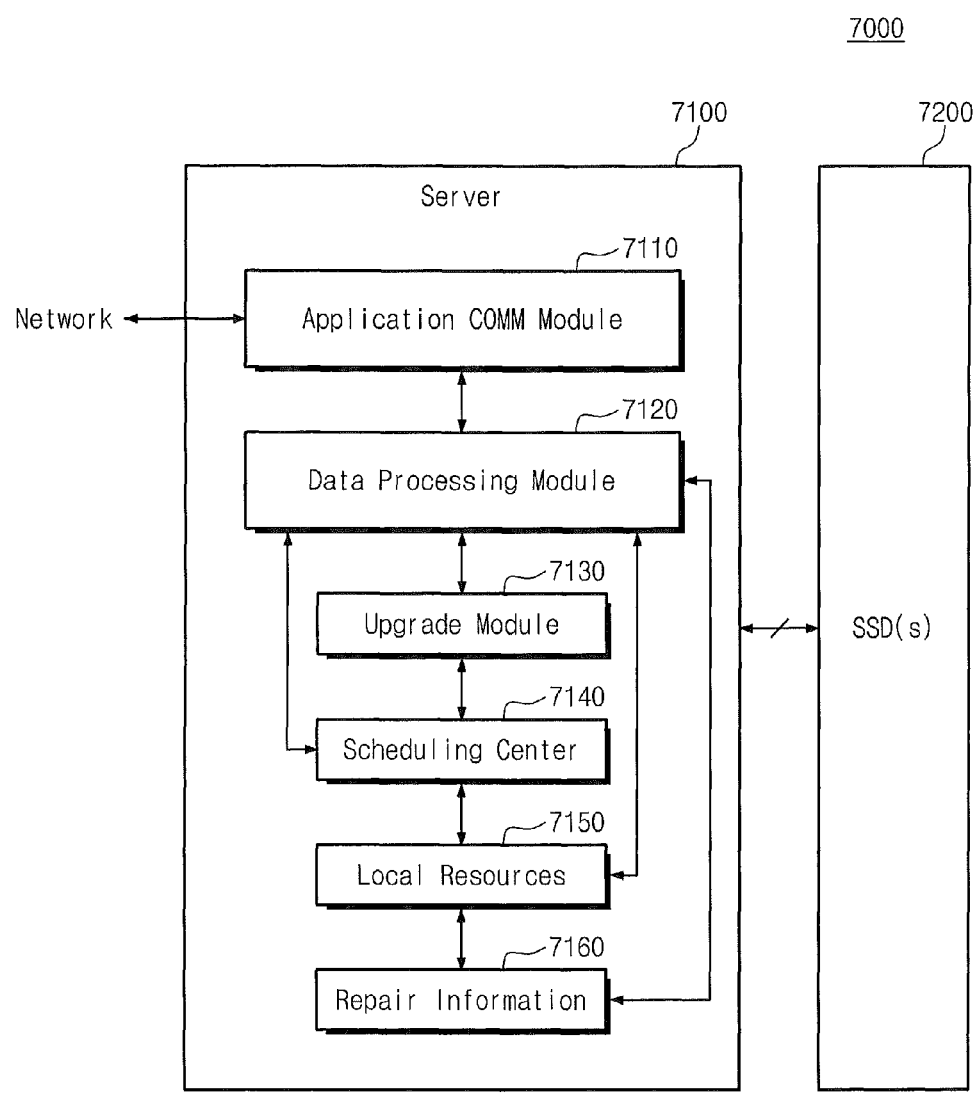
FIG. 30 is a block diagram schematically illustrating a server system including an SSD in FIG. 17 according to an embodiment of the inventive concept.

FIG. 30 is a block diagram schematically illustrating a server system including an SSD in FIG. 17 according to an embodiment of the inventive concept. Referring to FIG. 30, a server system 7000 may include a server 7100 and an SSD 7200 that stores data used to drive the server 7100. The SSD 7200 may be configured the same as an SSD 4000 of FIG. 27. The server 7100 may include an application communication module 7110, a data processing module 7120, an upgrade module 7130, a scheduling center 7140, a local resource module 7150, and a repair information module 7160. The application communication module 7110 may be configured to communicate with a computing system connected to a network and the server 7100 or to allow the server 7100 to communicate with the SSD 7200. The application communication module 7110 may transmit data or information, provided through a user interface, to the data processing module 7120.

The data processing module 7120 may be linked to the local resource module 7150. Here, the local resource module 7150 may provide a list of repair shops/dealers/technical information to a user on the basis of information or data inputted to the server 7100. The upgrade module 7130 may interface with the data processing module 7120. Based on information or data received from the SSD 7200, the upgrade module 7130 may perform upgrades of a firmware, a reset code, a diagnosis system, or other information on electronic appliances.

The scheduling center 7140 may provide real-time options to the user based on the information or data inputted to the server 7100. The repair information module 7160 may interface with the data processing module 7120. The repair information module 7160 may be used to provide repair-related information (e.g., audio, video or document files) to the user. The data processing module 7120 may package information related to the information received from the SSD 7200. The packaged information may be transmitted to the SSD 7200 or may be displayed to the user.

Figure 31:
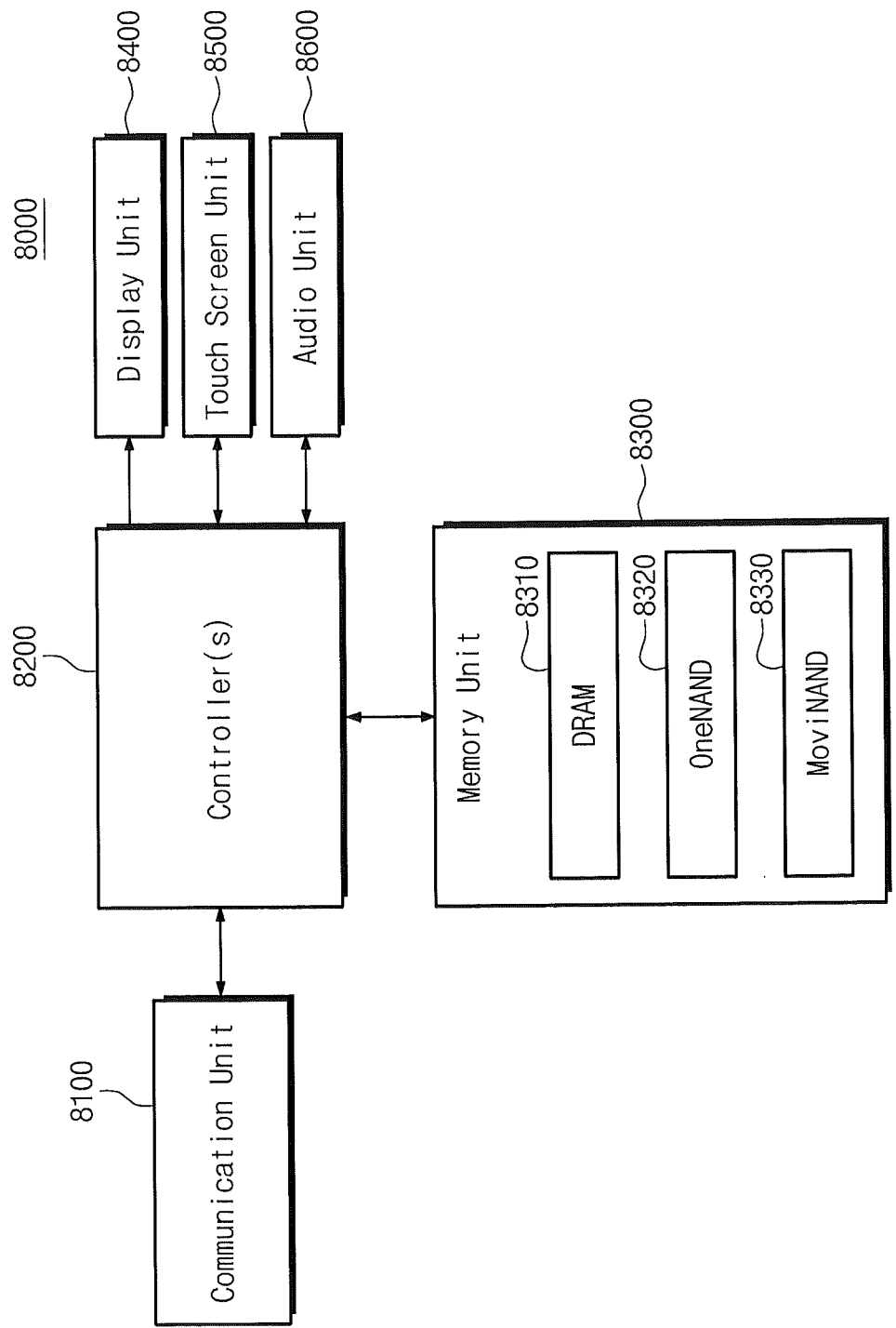
FIG. 31 is a diagram schematically illustrating a mobile device according to an embodiment of the inventive concept.

FIG. 31 is a diagram schematically illustrating a mobile device according to an embodiment of the inventive concept. Referring to FIG. 31, a mobile device 8000 may include a communication unit 8100, a controller 8200, a memory unit 8300, a display unit 8400, a touch screen unit 8500, and an audio unit 8600. The memory unit 8300 may include at least one DRAM 8310, at least one OneNAND 8320, and at least one moviNAND 8330. A block copy method executed in a reprogramming manner described in relation to FIGS. 1 to 23 may be applied to at least one of the OneNAND 8320 and the moviNAND 8330. Detailed description of the mobile device is disclosed in U.S. Patent Publication Nos. 2010/0010040, 2010/0062715, 2010/0309237, and 2010/0315325, the entirety of which is incorporated by reference herein. A nonvolatile memory device according to an embodiment of the inventive concept is applicable to tablet products (e.g., Galaxy Tab, iPad, etc.).

Figure 32:
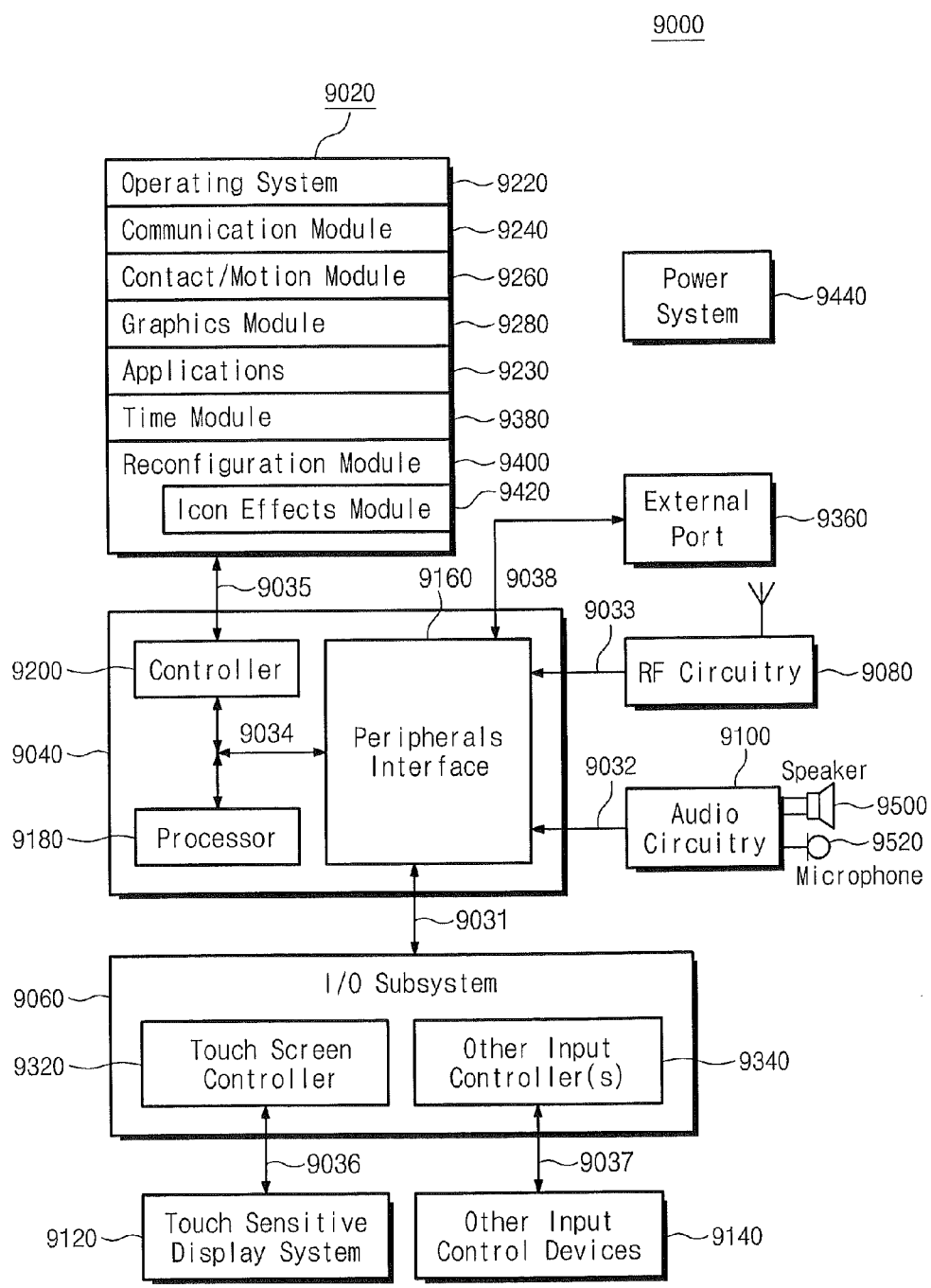
FIG. 32 is a diagram schematically illustrating a handheld electronic device according to an embodiment of the inventive concept.

FIG. 32 is a diagram schematically illustrating a handheld electronic device according to an embodiment of the inventive concept. Referring to FIG. 32, a handheld electronic device 9000 may include at least one computer-readable media 9020, a processing system 9040, an input/output subsystem 9060, a radio frequency circuit 9080, and an audio circuit 9100. Respective constituent elements can be interconnected by at least one communication bus or a signal line 9030.

The handheld electronic device 9000 may be a portable electronic device including a handheld computer, a tablet computer, a cellular phone, a media player, a PDA, or a combination of two or more thereof. Herein, a block copy method executed in a reprogramming manner described in relation to FIGS. 1 to 23 may be applied to the at least one computer-readable media 9020. Detailed description of the handheld electronic device 9000 is disclosed in U.S. Pat. No. 7,509,588, the entirety of which is incorporated by reference herein.

A memory system or a storage device according to the inventive concept may be mounted in various types of packages. Examples of the packages of the memory system or the storage device according to the inventive concept may include Package on Package (PoP), Ball Grid Arrays (BGAs), Chip Scale Packages (CSPs), Plastic Leaded Chip Carrier (PLCC), Plastic Dual In-line Package (PDIP), Die in Waffle Pack, Die in Wafer Form, Chip On Board (COB), Ceramic Dual In-line Package (CERDIP), Plastic Metric Quad Flat Pack (MQFP), Thin Quad Flat Pack (TQFP), Small Outline Integrated Circuit (SOIC), Shrink Small Outline Package (SSOP), Thin Small Outline Package (TSOP), System In Package (SIP), Multi Chip Package (MCP), Wafer-level Fabricated Package (WFP), and Wafer-level Processed Stack Package (WSP).

The above-disclosed subject matter is to be considered illustrative, and not restrictive, and the appended claims are intended to cover all such modifications, enhancements, and other embodiments, which fall within the true spirit and scope. Thus, to the maximum extent allowed by law, the scope is to be determined by the broadest permissible interpretation of the following claims and their equivalents, and shall not be restricted or limited by the foregoing detailed description.

What is claimed is:

1. A method of operating a nonvolatile memory device, comprising:
    performing error checking and correction (ECC) operations on M pages of data read from a first portion of M-bit nonvolatile memory cells within the nonvolatile memory device to thereby generate M pages of ECC-processed data, where M is a positive integer greater than two; and
    programming a second portion of M-bit nonvolatile memory cells within the nonvolatile memory device with the M pages of ECC-processed data using an address-scrambled reprogramming technique.

2. The method of claim 1, wherein the nonvolatile memory device comprises multiple nonvolatile memory chips; and wherein the first and second portions of M-bit nonvolatile memory cells are located on the same or separate nonvolatile memory chips within the nonvolatile memory device.

3. The method of claim 1, wherein said address-scrambled reprogramming technique comprises programming a plurality of M-bit nonvolatile memory cells at least M−1 times.

4. The method of claim 1, wherein said address-scrambled reprogramming technique comprises programming a plurality of M-bit nonvolatile memory cells into a respective plurality of program states and then reprogramming the plurality of M-bit nonvolatile memory cells so that threshold voltages of the plurality of M-bit nonvolatile memory cells are changed but their respective plurality of program states remain unchanged.

5. The method of claim 4, wherein the address-scrambled reprogramming technique comprises programming a target page of M-bit nonvolatile memory cells M times using a $2^{M-1}$-$2^M$-$2^M$ programming sequence or a $2^M$-$2^M$-$2^M$ programming sequence.

6. The method of claim 1, wherein said performing ECC operations is preceded by reading M-pages of data from a source page of M-bit nonvolatile memory cells into a page buffer associated with a first block of nonvolatile memory within the nonvolatile memory device.

7. The method of claim 6, wherein said performing ECC operations is preceded by sequentially transferring the M-pages of data from the page buffer to an ECC circuit.

8. The method of claim 7, wherein the nonvolatile memory device comprises at least one nonvolatile memory chip; and wherein the page buffer and ECC circuit are located on the same nonvolatile memory chip.

9. The method of claim 7, wherein the nonvolatile memory device comprises a nonvolatile buffer memory of single-bit nonvolatile memory cells; and wherein said programming is preceded by transferring the M pages of ECC-processed data to the nonvolatile buffer memory.

10. The method of claim 9, wherein said programming is preceded by reading the M pages of ECC-processed data from the nonvolatile buffer memory into the page buffer.

11. The method of claim 9, wherein said programming comprises reading the M pages of ECC-processed data from the nonvolatile buffer memory into the page buffer multiple times.

12. The method of claim 9, wherein said programming is performed concurrently with reading the M pages of ECC-processed data from the nonvolatile buffer memory into the page buffer.

13. The method of claim 7, wherein the ECC circuit is located within a memory controller comprising a random access buffer memory; and wherein said programming is preceded by transferring the M pages of ECC-processed data to the random access buffer memory and then to the page buffer.

14. The method of claim 7, wherein the ECC circuit is located within a memory controller comprising a random access buffer memory; and wherein said programming is preceded by transferring the M pages of ECC-processed data directly from the ECC circuit to the page buffer.

15. The method of claim 1, wherein the address-scrambled reprogramming technique comprises programming the second portion of M-bit nonvolatile memory cells associated with a first word line at least first and second times; and wherein the address-scrambled reprogramming technique comprises programming a third portion of M-bit nonvolatile memory cells associated with a second word line between the first and second times.

* * * * *